(12) United States Patent
Fuji

(10) Patent No.: US 12,168,262 B2
(45) Date of Patent: Dec. 17, 2024

(54) JOINT STRUCTURE, SEMICONDUCTOR DEVICE, AND JOINING METHOD

(71) Applicant: ROHM CO., LTD., Kyoto (JP)

(72) Inventor: Kazunori Fuji, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 830 days.

(21) Appl. No.: 17/267,595

(22) PCT Filed: Aug. 23, 2019

(86) PCT No.: PCT/JP2019/032966
§ 371 (c)(1),
(2) Date: Feb. 10, 2021

(87) PCT Pub. No.: WO2020/045263
PCT Pub. Date: Mar. 5, 2020

(65) Prior Publication Data
US 2021/0308791 A1 Oct. 7, 2021

(30) Foreign Application Priority Data

Aug. 30, 2018 (JP) ................................ 2018-161045

(51) Int. Cl.
*B23K 26/082* (2014.01)
*B23K 26/21* (2014.01)
*H01L 23/00* (2006.01)

(52) U.S. Cl.
CPC ............. *B23K 26/082* (2015.10); *B23K 26/21* (2015.10); *H01L 24/03* (2013.01); *H01L 24/04* (2013.01);
(Continued)

(58) Field of Classification Search
CPC ....... B23K 26/082; B23K 26/21; H01L 24/03; H01L 24/04; H01L 2224/4847; H01L 2224/73265
(Continued)

(56) References Cited

U.S. PATENT DOCUMENTS 4,241,103 A * 12/1980 Ohkubo ................ B41J 2/3351
29/621
4,658,110 A * 4/1987 Miller .................... B23K 26/22
219/121.13
(Continued)

FOREIGN PATENT DOCUMENTS

JP 2007-253179 A 10/2007
JP 2009-183970 A 8/2009
(Continued)

OTHER PUBLICATIONS

International Search Report issued in PCT/JP2019/032966, Oct. 21, 2019 (2 pages).
(Continued)

*Primary Examiner* — Jimmy Chou
(74) *Attorney, Agent, or Firm* — HSML P.C.

(57) ABSTRACT

A joint structure includes a first and a second metal member overlapping with each other as viewed in a first direction. The first metal member and the second metal member are joined together. The joint structure includes a welded portion at which the first metal member and the second metal member, overlapping with each other, are partly fused to each other. The welded portion has an outer circumferential edge and a plurality of linear marks. The outer circumferential edge is annular as viewed in the first direction. The plurality of linear marks each extend from an inside of the welded portion toward the outer circumferential edge as viewed in the first direction. Each of the plurality of linear
(Continued)

marks is curved to bulge to one sense of an annular direction along the outer circumferential edge.

17 Claims, 24 Drawing Sheets

(52) U.S. Cl.
CPC .............. *H01L 2224/4847* (2013.01); *H01L 2224/73265* (2013.01)

(58) Field of Classification Search
USPC ...................................................... 219/121.4
See application file for complete search history.

(56) References Cited

U.S. PATENT DOCUMENTS

| | | | | |
|---|---|---|---|---|
| 5,786,576 | A * | 7/1998 | Lunden | B23K 13/02 |
| | | | | 219/676 |
| 9,815,142 | B2 * | 11/2017 | Ogura | B23K 26/244 |
| 11,305,381 | B2 * | 4/2022 | Kobayashi | B23K 26/02 |
| 2003/0112322 | A1 * | 6/2003 | Tanaka | H01L 27/12 |
| | | | | 347/256 |
| 2014/0291304 | A1 * | 10/2014 | Mudd, II | B23K 26/20 |
| | | | | 219/121.64 |
| 2015/0283648 | A1 * | 10/2015 | Hisada | B23K 26/22 |
| | | | | 219/121.64 |
| 2016/0016261 | A1 * | 1/2016 | Mudd, II | B23K 26/044 |
| | | | | 219/121.64 |
| 2016/0303688 | A1 * | 10/2016 | De Souza | B23K 26/21 |
| 2017/0001261 | A1 * | 1/2017 | Fujiwara | B23K 26/082 |
| 2017/0028507 | A1 * | 2/2017 | Tsukui | B23K 26/0676 |
| 2017/0050269 | A1 * | 2/2017 | Nakagawa | B23K 26/082 |
| 2018/0009060 | A1 * | 1/2018 | Yang | B23K 26/0626 |
| 2018/0021887 | A1 * | 1/2018 | Liu | B23K 26/342 |
| | | | | 219/121.75 |
| 2018/0021888 | A1 * | 1/2018 | Liu | B23K 26/035 |
| | | | | 219/121.64 |
| 2018/0043472 | A1 * | 2/2018 | Yang | B23K 26/322 |
| 2018/0071866 | A1 * | 3/2018 | Aoki | B23K 26/082 |
| 2018/0099357 | A1 * | 4/2018 | Hisada | B23K 26/32 |
| 2018/0126491 | A1 * | 5/2018 | Nakagawa | B23K 26/0626 |
| 2019/0030645 | A1 * | 1/2019 | Tanaka | B23K 26/0626 |
| 2019/0329353 | A1 * | 10/2019 | Dai | B23P 15/00 |

FOREIGN PATENT DOCUMENTS

| | | | | |
|---|---|---|---|---|
| JP | 2011-173146 | A | | 9/2011 |
| JP | 2012-252935 | A | | 12/2012 |
| JP | 2013-132686 | A | | 7/2013 |
| JP | 2013157550 | A | * 8/2013 | ......... H01L 23/3735 |
| JP | 2016-221527 | A | | 12/2016 |
| WO | WO-2015129231 | A1 | * 9/2015 | ......... B23K 26/0626 |

OTHER PUBLICATIONS

Office Action received in the corresponding Japanese Patent application, Dec. 5, 2023, and machine translation (6 pages).
Office Action received in the corresponding Japanese Patent application, Jul. 4, 2023, and machine translation (11 pages).

* cited by examiner

JOINT STRUCTURE, SEMICONDUCTOR DEVICE, AND JOINING METHOD

TECHNICAL FIELD

The present disclosure relates to a joint structure obtained by joining a first metal member and a second metal member, a semiconductor device including the joint structure, and a method for joining the first metal member and the second metal member.

BACKGROUND ART

Semiconductor devices of recent years have a large current capability and high efficiency. As such, there is a demand for the semiconductor devices to have lower resistance. In response to such a demand, a method has been developed for directly joining two metal members without using any bonding wires or the like. For example, Patent Document 1 discloses a technique of joining two metal members (a metal terminal and a metal plate) by ultrasonic welding.

PRIOR ART DOCUMENT

Patent Document

Patent Document 1: JP-A-2016-221527

SUMMARY OF THE INVENTION

Technical Problem

In ultrasonic welding, two metal members are joined together by applying ultrasonic vibrations while pressing one of the metal members against the other. However, in ultrasonic welding, two metal members rub against each other, and the metal members may wear as the result. Such surface damage causes the performance degradation of the semiconductor device.

The present disclosure has been conceived in view of the above problem, and an object thereof is to provide a joint structure capable of suppressing surface damage resulting from joining two metal members. Another object of the present disclosure is to provide a semiconductor device including the joint structure, and a method for joining two metal members.

Solution to Problem

A first aspect of the present disclosure provides a joint structure comprising a first metal member and a second metal member that overlap with each other as viewed in a first direction and that are joined to each other. The joint structure includes a welded portion in which a part of the first metal member and a part of the second metal member are fused to each other in an area where the first metal member and the second metal member overlap with each other. The welded portion has an outer circumferential edge that is annular as viewed in the first direction, and a plurality of linear marks each extending from an inside of the welded portion toward the outer circumferential edge as viewed in the first direction. Each of the plurality of linear marks is curved to bulge to one side in an annular direction along the outer circumferential edge.

In a preferred embodiment of the joint structure, the outer circumferential edge has an annular shape centered at a first reference point, and each of the plurality of linear marks extends from the first reference point toward the outer circumferential edge, and bulges in a first sense of a circumferential direction of the outer circumferential edge.

In a preferred embodiment of the joint structure, the welded portion further includes a crater portion that is circular as viewed in the first direction, and the crater portion has a diameter smaller than a radius of the outer circumferential edge.

In a preferred embodiment of the joint structure, a center of the crater portion as viewed in the first direction is located at a midpoint of a line segment connecting the first reference point and the outer circumferential edge.

In a preferred embodiment of the joint structure, each of the plurality of linear marks has an arc shape as viewed in the first direction, and the plurality of linear marks include a number of linear marks configured such that their radiuses of curvature are smaller as disposed ahead in a second sense of the circumferential direction.

In a preferred embodiment of the joint structure, the welded portion includes a bottom portion overlapping with the second metal member as viewed in a second direction perpendicular to the first direction.

In a preferred embodiment of the joint structure, the bottom portion is annular in a cross-section perpendicular to the first direction.

A second aspect of the present disclosure provides a semiconductor device including a joint structure provided by the first aspect. The semiconductor device includes: an insulating substrate having an obverse surface and a reverse surface separated apart from each other in the first direction; a first conductive member disposed on the obverse surface; a first switching element conductively bonded to the first conductive member; a first terminal including a first terminal portion and electrically connected to the first conductive member; and a second terminal including a second terminal portion and electrically connected to the first switching element.

In a preferred embodiment of the semiconductor device, the welded portion comprises a first joining portion extending from the first terminal as the first metal member into the first conductive member as the second metal member.

In a preferred embodiment of the semiconductor device, the first terminal is thinner than the first conductive member.

In a preferred embodiment of the semiconductor device, the semiconductor device includes: a second conductive member disposed on the obverse surface and separated apart from the first conductive member; a second switching element conductively bonded to the second conductive member; and a third terminal including a third terminal portion and electrically connected to the second conductive member, wherein the first conductive member is electrically connected to the second switching element.

In a preferred embodiment of the semiconductor device, the welded portion comprises a second joining portion extending from the third terminal as the first metal member into the second conductive member as the second metal member.

In a preferred embodiment of the semiconductor device, the third terminal is thinner than the second conductive member.

In a preferred embodiment of the semiconductor device, the semiconductor device further includes an insulating member disposed between the second terminal portion and the third terminal portion in the first direction, where a part of the insulating member overlaps with the second terminal portion and the third terminal portion as viewed in the first direction.

In a preferred embodiment of the semiconductor device, the semiconductor device further includes a bus bar that includes a first supply terminal, a second supply terminal, and an insulator, where the second supply terminal is separated apart from the first supply terminal in the first direction, and at least partially overlaps with the first supply terminal as viewed in the first direction. The insulator is disposed between the first supply terminal and the second supply terminal in the first direction. The first supply terminal is conductively bonded to the second terminal portion, and the second supply terminal is conductively bonded to the third terminal.

In a preferred embodiment of the semiconductor device, the semiconductor device further includes a capacitor connected in parallel to the first supply terminal and the second supply terminal.

In a preferred embodiment of the semiconductor device, the welded portion comprises a third joining portion extending from the first supply terminal as the first metal member into the second terminal portion as the second metal member.

In a preferred embodiment of the semiconductor device, the first supply terminal includes an end portion that is recessed in an area overlapping with the second terminal portion as viewed in the first direction.

In a preferred embodiment of the semiconductor device, the end portion includes a base portion, and two extended portions extending from the base portion, and the third joining portion is provided for the two extended portions and the base portion.

A third aspect of the present disclosure provides a joining method including: a step of preparing a first metal member; a step of preparing a second metal member and arranging the second metal member to overlap with the first metal member as viewed in the first direction; and a laser welding step of irradiating the first metal member with a laser beam in an area in which the first metal member and the second metal member overlap with each other, thereby fusing a part of the first metal member and a part of the second metal member, where the laser welding step comprises: first scanning performed by moving the laser beam along a first trajectory that is annular as viewed in the first direction; and second scanning performed by moving a reference position of the first trajectory along a second trajectory.

In a preferred embodiment of the joining method, the laser welding step comprises moving the laser beam by changing an irradiation position of the laser beam with use of a galvano scanner.

In a preferred embodiment of the joining method, the first trajectory and the second trajectory are circular.

In a preferred embodiment of the joining method, the first trajectory and the second trajectory have substantially the same diameter.

In a preferred embodiment of the joining method, the second scanning comprises moving the laser beam in a manner making at least one complete turn along the second trajectory.

In a preferred embodiment of the joining method, the second scanning comprises, prior to moving the laser beam along the second trajectory, starting the irradiation of the laser beam at a central position of the second trajectory and moving the laser beam linearly away from the central position of the second trajectory in a radius direction.

In a preferred embodiment of the joining method, the laser beam has a diameter of 20 μm and a moving speed of 1000 to 1500 mm/s.

Effects of Invention

According to the joint structure of the present disclosure and the joining method of the present disclosure, the surface damage of two metal members can be suppressed. Furthermore, according to the semiconductor device of the present disclosure, the performance degradation can be suppressed by suppressing the surface damage of two metal members.

MODE FOR CARRYING OUT THE INVENTION

Preferred embodiments of a joint structure, a semiconductor device, and a joining method according to the present disclosure will be described below with reference to the drawings.

Figure 1:
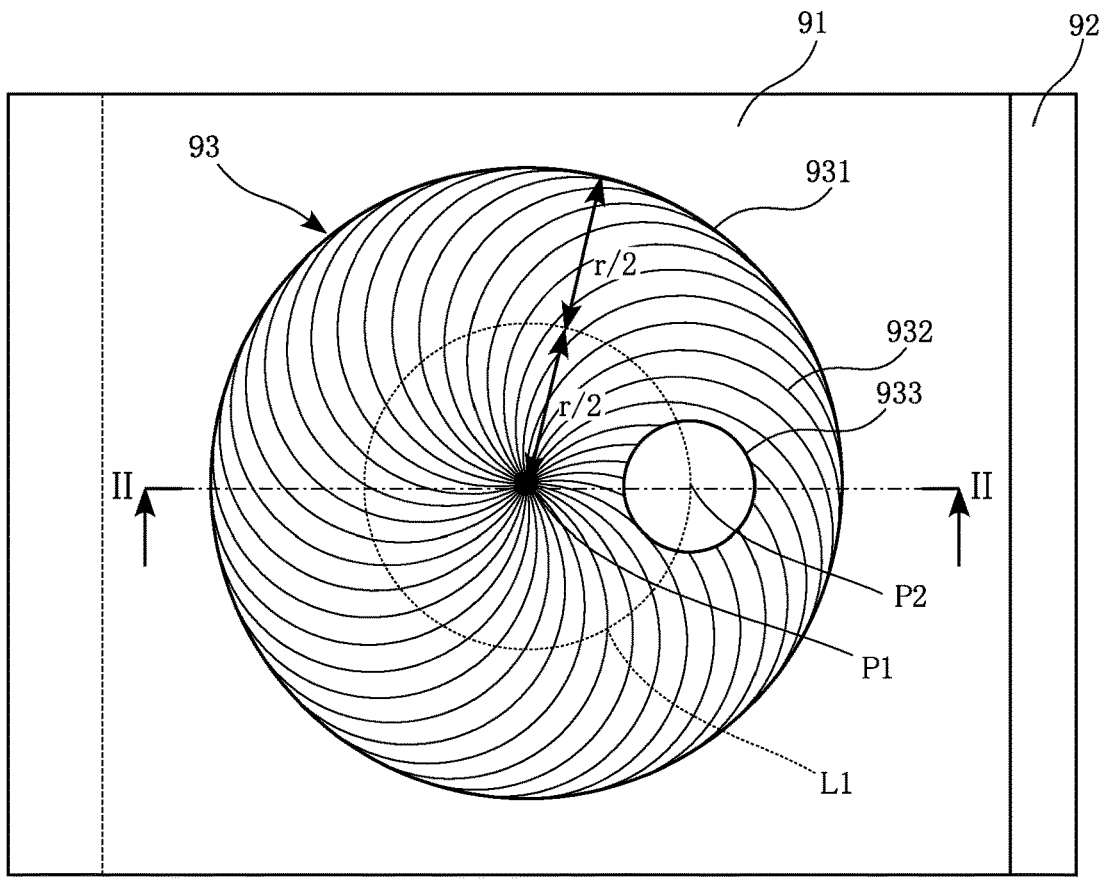
FIG. 1 is a plan view showing a joint structure according to a first embodiment.
Figure 2:
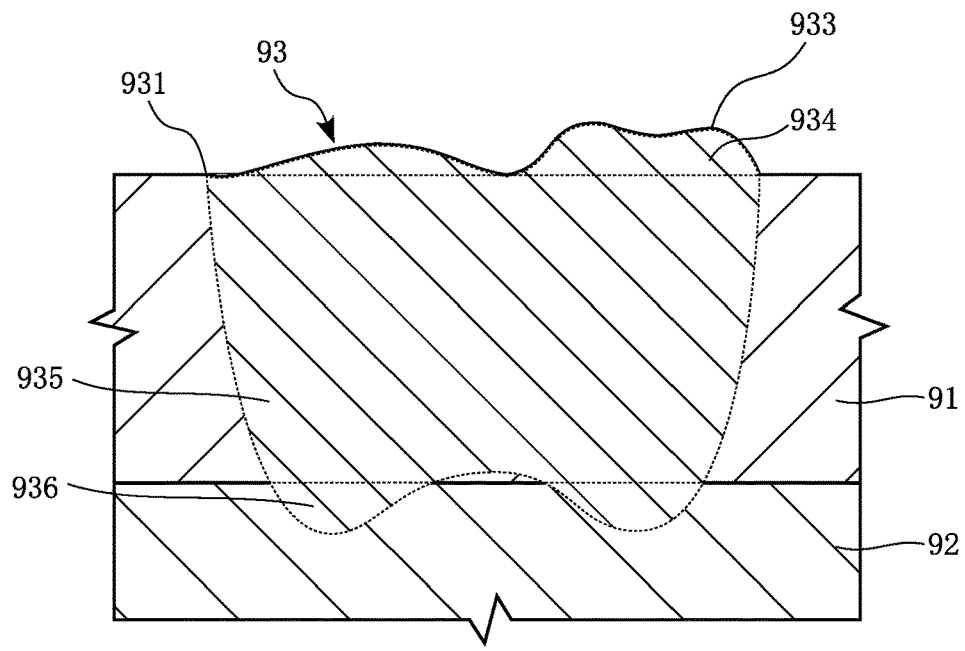
FIG. 2 is a cross-sectional view along line II-II in FIG. 1 and schematically showing the sectional structure of the joint structure.

First, a joint structure according to a first embodiment of the present disclosure will be described with reference to FIGS. 1 and 2. A joint structure A1 according to the first embodiment includes a first metal member 91, a second metal member 92, and a welded portion 93. FIG. 1 is a plan view showing the joint structure A1. FIG. 2 is a cross-sectional view along line II-II in FIG. 1 and schematically showing the sectional structure of the joint structure A1. For convenience of explanation, the vertical direction in FIG. 2 is defined as a thickness direction. In other words, the plan view of FIG. 1 shows the joint structure A1 as viewed from top to bottom in the thickness direction.

The first metal member 91 and the second metal member 92 are metal plates, for example. The metal plates are made of copper (Cu) or a Cu alloy, for example. The first metal member 91 is thinner than the second metal member 92. For example, the first metal member 91 has a thickness of 0.8 mm, and the second metal member 92 has a thickness of 3.0 mm. Note that the thickness of each of the first metal member 91 and the second metal member 92 is not limited to the example above. As shown in FIG. 1, the first metal member 91 and the second metal member 92 partially overlap with each other in plan view. As shown in FIG. 2, the first metal member 91 and the second metal member 92 are in contact with each other in the thickness direction, except for the welded portion 93. The first metal member 91 is provided on top of the second metal member 92 (i.e., upper side in FIG. 2).

As shown in FIG. 2, the welded portion 93 is a portion where a part of the first metal member 91 and a part of the second metal member 92 are fused to each other. The welded portion 93 joins the first metal member 91 and the second metal member 92. As shown in FIG. 1, the welded portion 93 is formed in an area where the first metal member 91 and the second metal member 92 overlap with each other in plan view. The welded portion 93 is formed by fusing the first metal member 91 and the second metal member 92 by laser welding. Specifically, the welded portion 93 is formed by first melting the first metal member 91 and the second metal member 92 with heat generated by laser irradiation, and then allowing the melted portion to solidify. The welded portion 93 is integrally formed with the first metal member 91 and the second metal member 92. In the area other than the welded portion 93, the first metal member 91 and the second metal member 92 are not joined to, but just held in contact with each other at their boundary. The welded portion 93 includes a portion where the materials of the first metal member 91 and the second metal member 92 are alloyed, a portion made of only the material of the first metal member 91, and a portion made of only the material of the second metal member 92. For example, the area at and near the interface between the first metal member 91 and the second metal member 92 before laser welding is likely to become the portion where the materials of the first metal member 91 and the second metal member 92 are alloyed. The upper part of the welded portion 93 (upper side in FIG. 2) is likely to become the portion made of only the material of the first metal member 91.

As shown in the plan view of FIG. 1, the welded portion 93 includes an outer circumferential edge 931, a plurality of linear marks 932, and a crater portion 933. They are welding marks resulting from laser-welding the first metal member 91 and the second metal member 92.

The outer circumferential edge 931 is a boundary between the welded portion 93 and the first metal member 91 in plan view. The outer circumferential edge 931 has an annular shape centered at a reference point P1 in plan view. The diameter of the outer circumferential edge 931 is 1.6 mm, for example, but it is not limited to such. In the example shown in FIG. 1, the outer circumferential edge 931 has a perfectly circular ring shape, but it is not limited to such. For example, the outer circumferential edge 931 may be distorted or zigzagged as a result of laser welding.

The plurality of linear marks 932 are streaks of welding marks formed in the welded portion 93 in plan view. As shown in FIG. 1, each of the linear marks 932 has an arc shape in plan view. Specifically, in plan view, each of the linear marks 932 extends from a reference point P1, which is the center of the outer circumferential edge 931, toward the outer circumferential edge 931, and is curved to bulge in one side in the annular direction along the outer circumferential edge 931. Since the outer circumferential edge 931 is annular in plan view in the present embodiment, the annular direction is the circumferential direction of the outer circumferential edge 931. In the example shown in FIG. 1, each of the linear marks 932 is curved to bulge in a counterclockwise circumferential direction of the outer circumferential edge 931.

The crater portion 933 is circular in plan view, for example. In plan view, the crater portion 933 has a smaller radius than the outer circumferential edge 931. The central position P2 of the crater portion 933 in plan view is located in the midpoint of one of the line segments that each connect the central position (equivalent to the reference point P1) of the outer circumferential edge 931 and the outer circumferential edge 931. In FIG. 1, the midpoints of the respective line segments are depicted as connected to each other by an auxiliary line L1. As shown in FIG. 2, the outer circumference of the crater portion 933 protrudes upward.

As shown in FIG. 2, the welded portion 93 has an upper portion 934, a body portion 935, and a bottom portion 936 in the sectional structure.

As shown in FIG. 2, the upper portion 934 is a part of the welded portion 93 located on the upper side in the thickness direction. The upper portion 934 protrudes above the first metal member 91.

The body portion 935 is a part of the welded portion 93 disposed between the upper portion 934 and the bottom portion 936. As shown in FIG. 2, the body portion 935 overlaps with the first metal member 91 as viewed in a direction perpendicular to the thickness direction.

The bottom portion 936 is a part of the welded portion 93 located on the lower side in the thickness direction. As shown in FIG. 2, the bottom portion 936 overlaps with the second metal member 92 as viewed in a direction perpendicular to the thickness direction. The bottom portion 936 is annular in cross-section on a plane perpendicular to the thickness direction, for example.

Next, a method for forming the joint structure A1 according to the first embodiment of the present disclosure, i.e., a method for joining the first metal member 91 and the second metal member 92, will be described with reference to FIGS. 3 to 5.

First, the first metal member 91 and the second metal member 92 are prepared. For example, a metal plate having a thickness of 0.8 mm is prepared as the first metal member 91, and a metal plate having a thickness of 3.0 mm metal plate is prepared as the second metal member 92. Then, the first metal member 91 and the second metal member 92 are arranged such that at least a part of the first metal member 91 and at least a part of the second metal member 92 overlap with each other in the thickness direction (see FIG. 3). At this point, a part of the first metal member 91 and a part of the second metal member 92 that are intended to be joined together are arranged to overlap with each other in the thickness direction. Then, the first metal member 91 and the second metal member 92 are temporarily fixed by a clamper or the like (not shown).

Next, the area in which the first metal member 91 and the second metal member 92 overlap with each other in plan view is irradiated with a laser beam, whereby the first metal member 91 and the second metal member 92 are laser-welded. The present embodiment describes an example of irradiating the surface (upper surface in FIG. 3) of the first metal member 91 with a laser beam, as shown in FIG. 3, to thereby laser-welding the first metal member 91 and the second metal member 92. The step of laser welding (laser welding step) described above may utilize a YAG laser, for example, and may be performed with a laser welding apparatus LD (see FIG. 3) described below. The laser welding apparatus LD is for laser-welding the first metal member 91 and the second metal member 92 that are temporarily fixed together.

Figure 3:
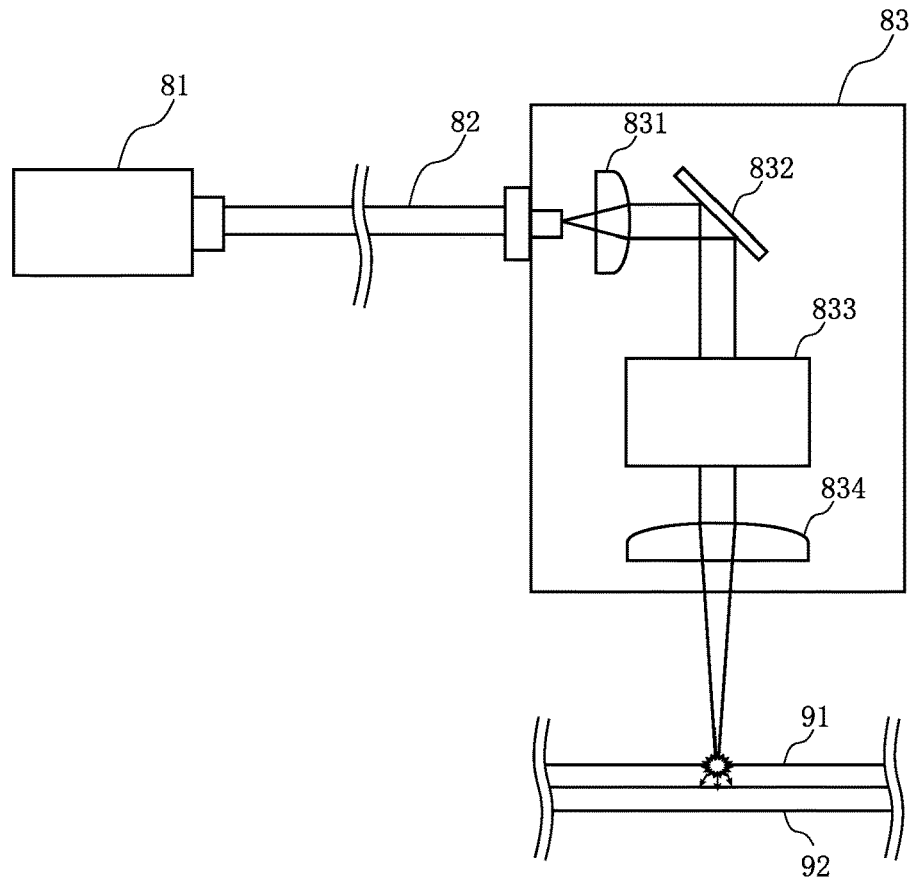
FIG. 3 is a schematic view showing a laser welding apparatus used in a joining method according to the first embodiment.

FIG. 3 shows an example of the laser welding apparatus LD. As shown in FIG. 3, the laser welding apparatus LD includes a laser oscillator 81, an optical fiber 82, and a laser head 83. The laser oscillator 81 oscillates a laser beam. The optical fiber 82 transmits the laser beam oscillated from the laser oscillator 81. The laser head 83 guides the laser beam emitted from the optical fiber 82 to the first metal member 91.

The laser head 83 includes a collimating lens 831, a mirror 832, a galvano scanner 833, and a condensing lens 834. The collimating lens 831 is a lens that collimates a laser beam (into parallel rays) emitted from the optical fiber 82. The mirror 832 reflects the laser beam collimated by the collimating lens 831 toward the first metal member 91. The galvano scanner 833 is for changing the laser-beam irradiation position on the first metal member 91. The galvano scanner 833 is, for example, a well-known scanner including a pair of movable mirrors (not shown) capable of swinging in two mutually perpendicular directions. The condensing lens 834 condenses the laser beam guided from the galvano scanner 833 onto the first metal member 91. In the present embodiment, the laser welding apparatus LD is controlled such that the diameter of the laser beam irradiating the first metal member 91 is approximately 20 µm, for example, and the moving speed of the laser beam is approximately 1000 to 1500 mm/s, for example. Furthermore, the peak power of the laser beam for irradiation is set to approximately 700 to 900 W, for example. The various numerical values mentioned above are merely examples, and are not limited to these examples.

Figure 4:
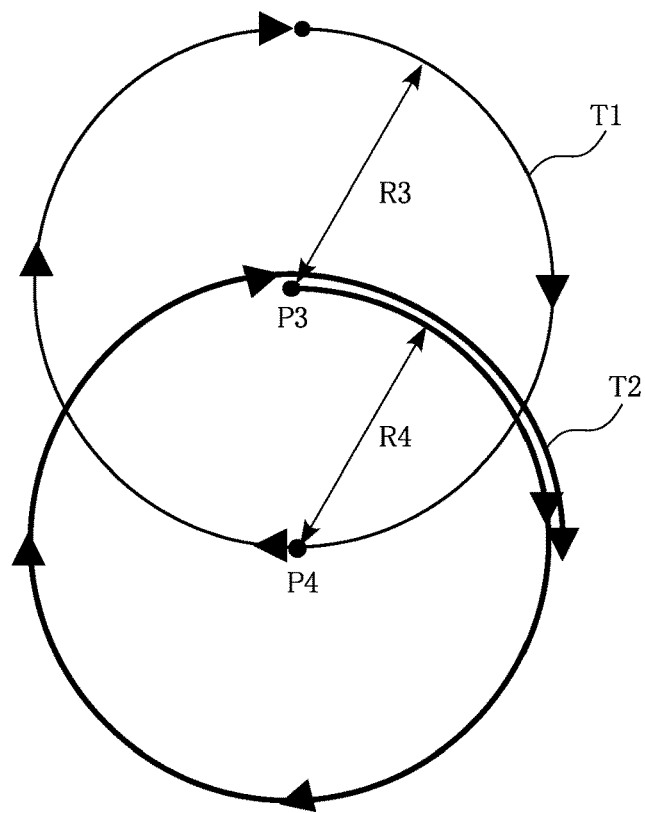
FIG. 4 shows the trajectory (first trajectory) of a first scan and the trajectory (second trajectory) of a second scan in the joining method according to the first embodiment.
Figure 5:
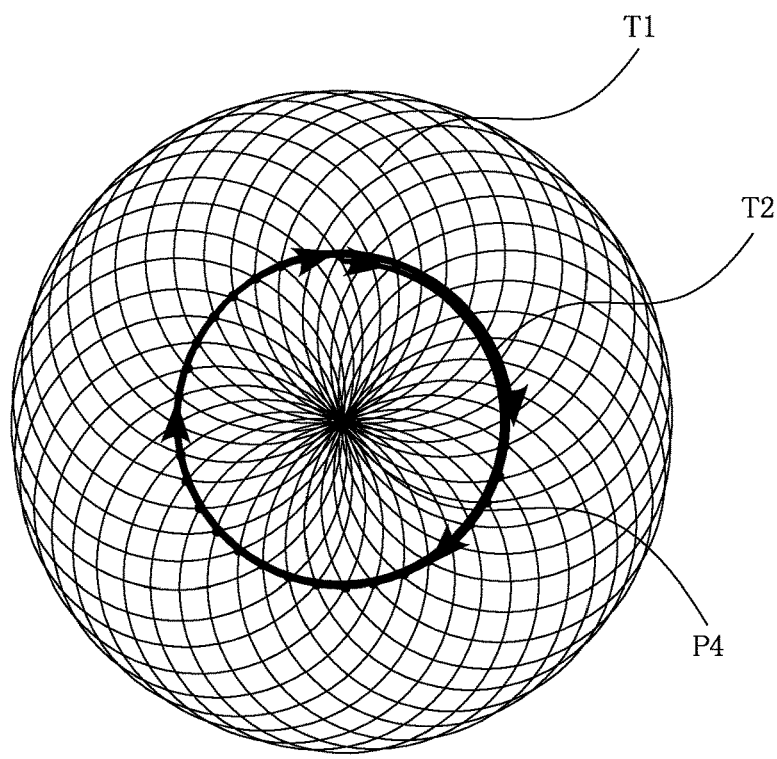
FIG. 5 shows the movement trajectory of laser beam during laser welding.

FIGS. 4 and 5 illustrate the trajectory of the laser beam applied by the laser welding apparatus LD. As described above, the galvano scanner 833 of the laser welding apparatus LD changes the irradiation position of the laser beam.

The laser welding apparatus LD performs a first scan in which a laser beam is moved along an annular first trajectory T1 in plan view, and a second scan in which the reference position of the first trajectory T1 is moved along a second trajectory T2.

In the first scan, a laser beam is applied so as to draw a circle. The circle has a radius R3 and is centered on a reference position P3, as shown in FIG. 4. As a result, the trajectory of a laser beam in the first scan forms the circular first trajectory T1 that has the radius R3 and is centered on the reference position P3, as shown in FIG. 4. The moving speed of a laser beam along the first trajectory T1 is 1000 to 1500 mm/s, which is mentioned above.

In the second scan, the reference position P3 for the first scan is moved so as to draw a circle that has a radius R4 and is centered on a reference position P4, as shown in FIG. 4. As a result, the trajectory of the reference position P3 forms the circular second trajectory T2 that has the radius R4 and is centered on the reference position P4. At this time, the radius R3 of the first trajectory T1 and the radius R4 of the second trajectory T2 are set to be approximately the same. The moving speed of the reference position P3 along the second trajectory T2 is approximately 5 mm/s. Note that the moving speed is not limited to this. In the second scan, the reference position P3 is moved around at least once along the second trajectory T2. In the present embodiment, the reference position P3 is moved to make one round and then successively moved ¼ round, as shown in FIG. 4. During the period of making one round along the second trajectory T2, the power of the laser beam is set to be large (e.g., the peak power). During the period of the remaining ¼ round, the power of the laser beam is gradually decreased so that the power becomes 0 w when the reference position P3 completes the ¼ round.

In the joining method of the present embodiment, the first scan is performed by moving a laser beam along the first trajectory T1, and the second scan is performed by moving the reference position P3 of the first trajectory T1 along the second trajectory T2. As such, the trajectory of the emitted laser beam during the laser welding step is as shown in FIG. 5. The outer circumference of the trajectory has a diameter of approximately 1.6 mm. In the joining method of the present embodiment, the moving speed of the first scan is approximately 1000 to 1500 mm/s, and the moving speed of the second scan is approximately 5 mm/s. Accordingly, the trajectory followed by the laser beam is such that parts of the plurality of first trajectories T1 drawn by the first scan overlap with each other, as shown in FIG. 5.

As a result of irradiation with a laser beam as described above, the parts irradiated with the laser beam generate heat and the first metal member 91 melts first. Then, as the first metal member 91 melts, the heat generated by the laser beam diffuses and causes the second metal member 92 to melt. As a result, a molten bath is created in which a part of the first metal member and a part of the second metal member 92 are melted.

Subsequently, the irradiation position of the laser beam is moved, whereby the heat source by the laser beam is moved, and the molten bath created as described above cools down and solidifies. When the molten bath solidifies, the first metal member 91 and the second metal member 92 are fused to each other and form the welded portion 93. At this time, the welded portion 93 is formed with a plurality of arcuate linear marks 932 since the movement along the second trajectory T2 causes the molten bath to melt and solidify in sequence. In addition, the molten bath created when the irradiation of the laser beam is stopped solidifies from its periphery, and therefore the resultant welded portion 93 is formed with the circular crater portion 933. In this way, the welded portion 93 is formed across the first metal member 91 and the second metal member 92 by laser welding, and the first metal member 91 and the second metal member 92 are joined by the welded portion 93.

Next, a semiconductor device according to the first embodiment of the present disclosure will be described with reference to FIGS. 6 to 17. A semiconductor device B1 according to the first embodiment includes a portion at which two metal members are joined by the above-described laser welding. Accordingly, the semiconductor device B1 according to the first embodiment has the welded portion 93, and includes the joint structure A1. The semiconductor device B1 includes an insulating substrate 10, a plurality of conductive members 11, a plurality of switching elements 20, two input terminals 31 and 32, an output terminal 33, a pair of gate terminals 34A and 34B, a pair of detection terminals 35A and 35B, a plurality of dummy terminals 36, a pair of side terminals 37A and 37B, a pair of insulating layers 41A and 41B, a pair of gate layers 42A and 42B, a pair of detection layers 43A and 43B, a plurality of base portions 44, a plurality of linear connecting members 51, a plurality of plate-like connecting members 52, a sealing resin 60, and a plurality of welded portions 93. The plurality of switching elements 20 include a plurality of switching elements 20A and a plurality of switching elements 20B.

Figure 6:
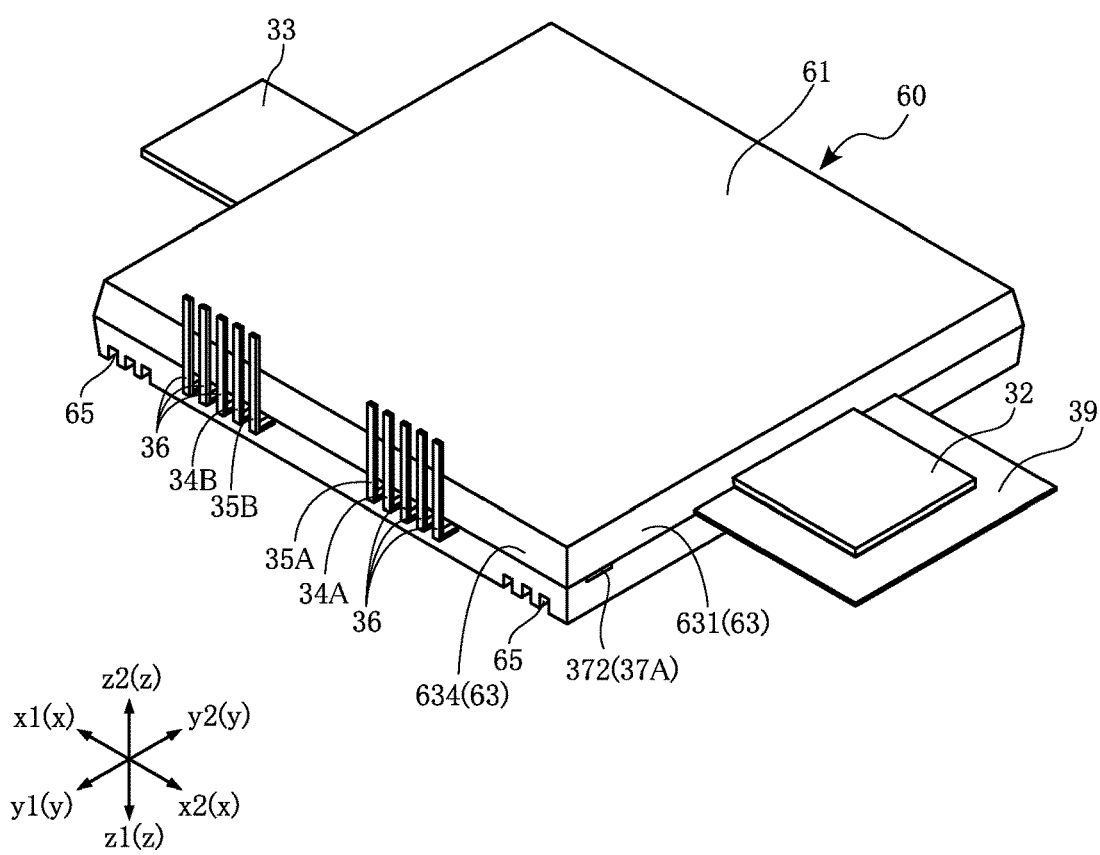
FIG. 6 is a perspective view showing the semiconductor device according to the first embodiment.
Figure 7:
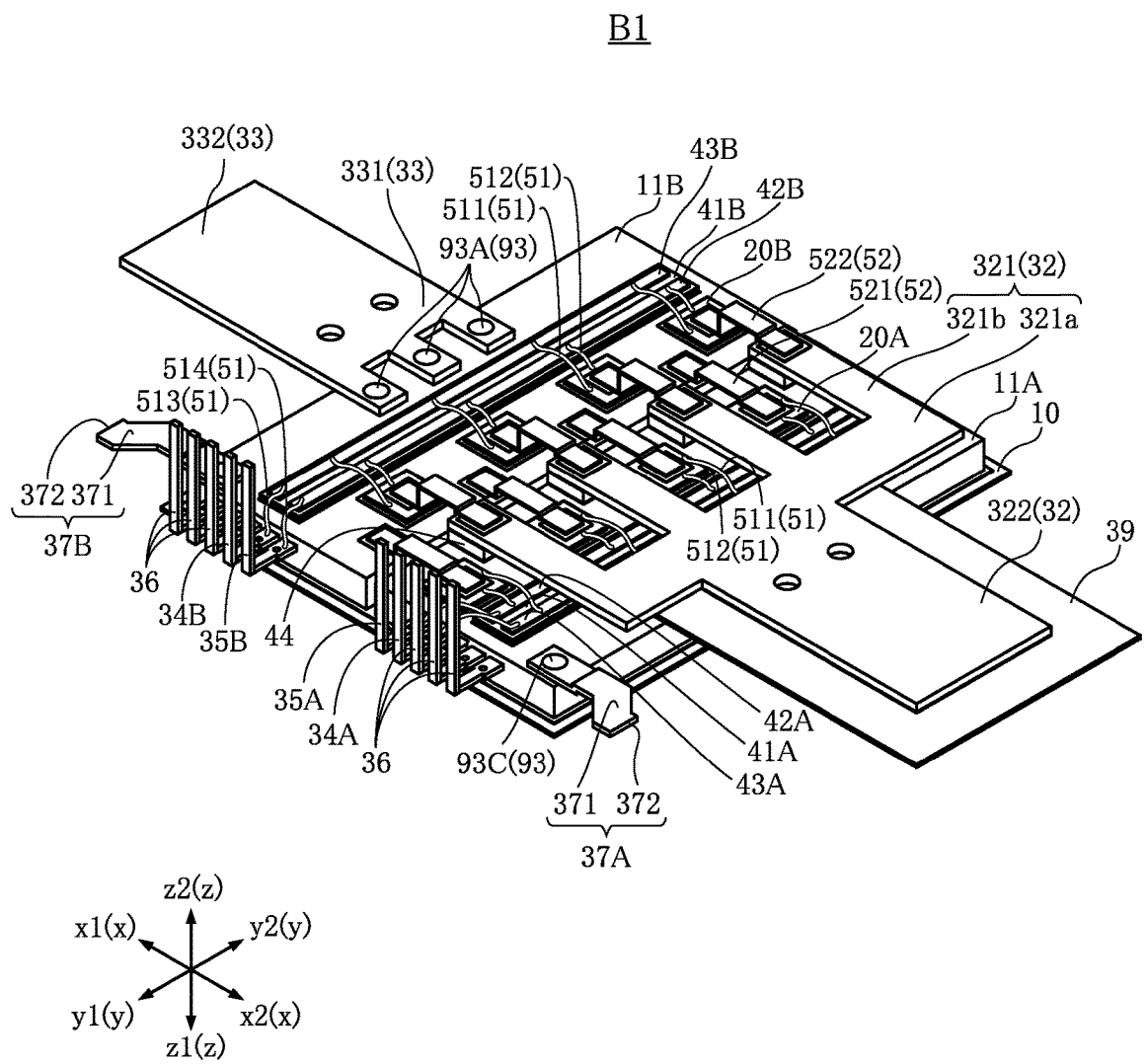
FIG. 7 is a perspective view obtained by omitting a sealing resin from FIG. 6.
Figure 8:
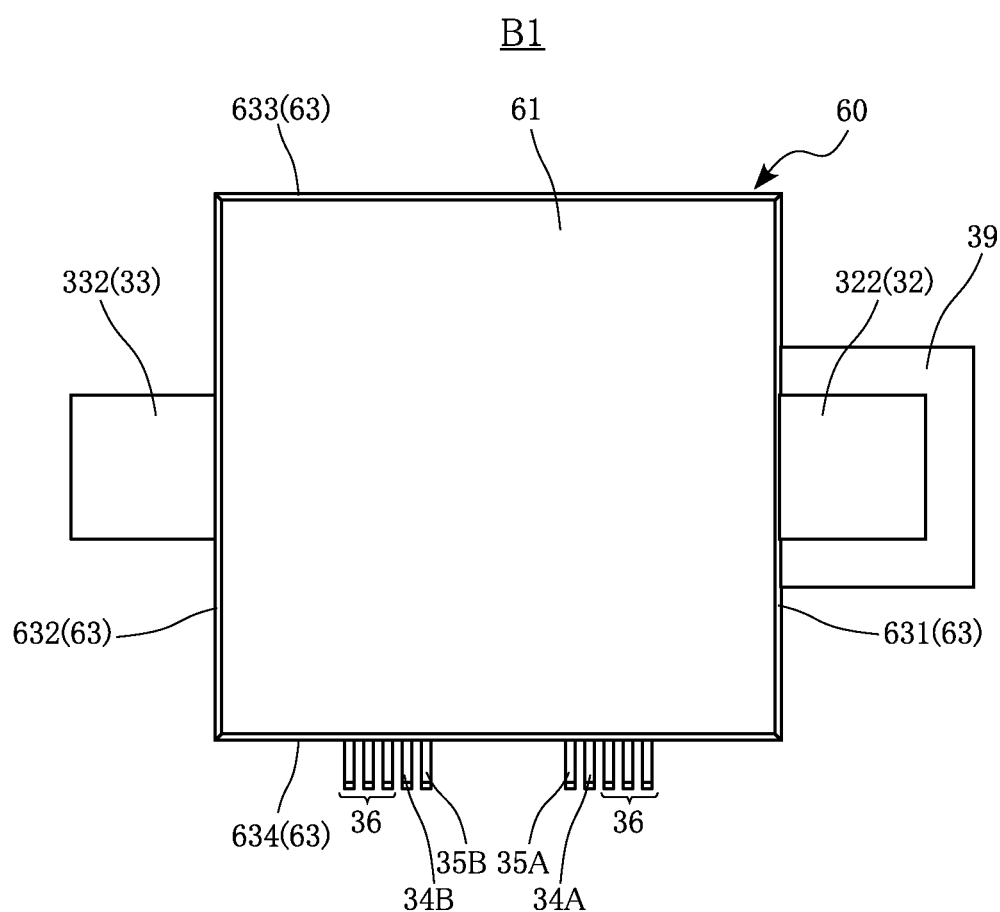
FIG. 8 is a plan view showing the semiconductor device according to the first embodiment.
Figure 8:
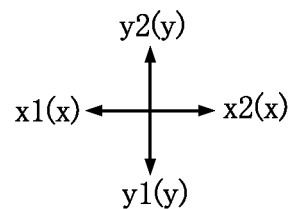
Figure 9:
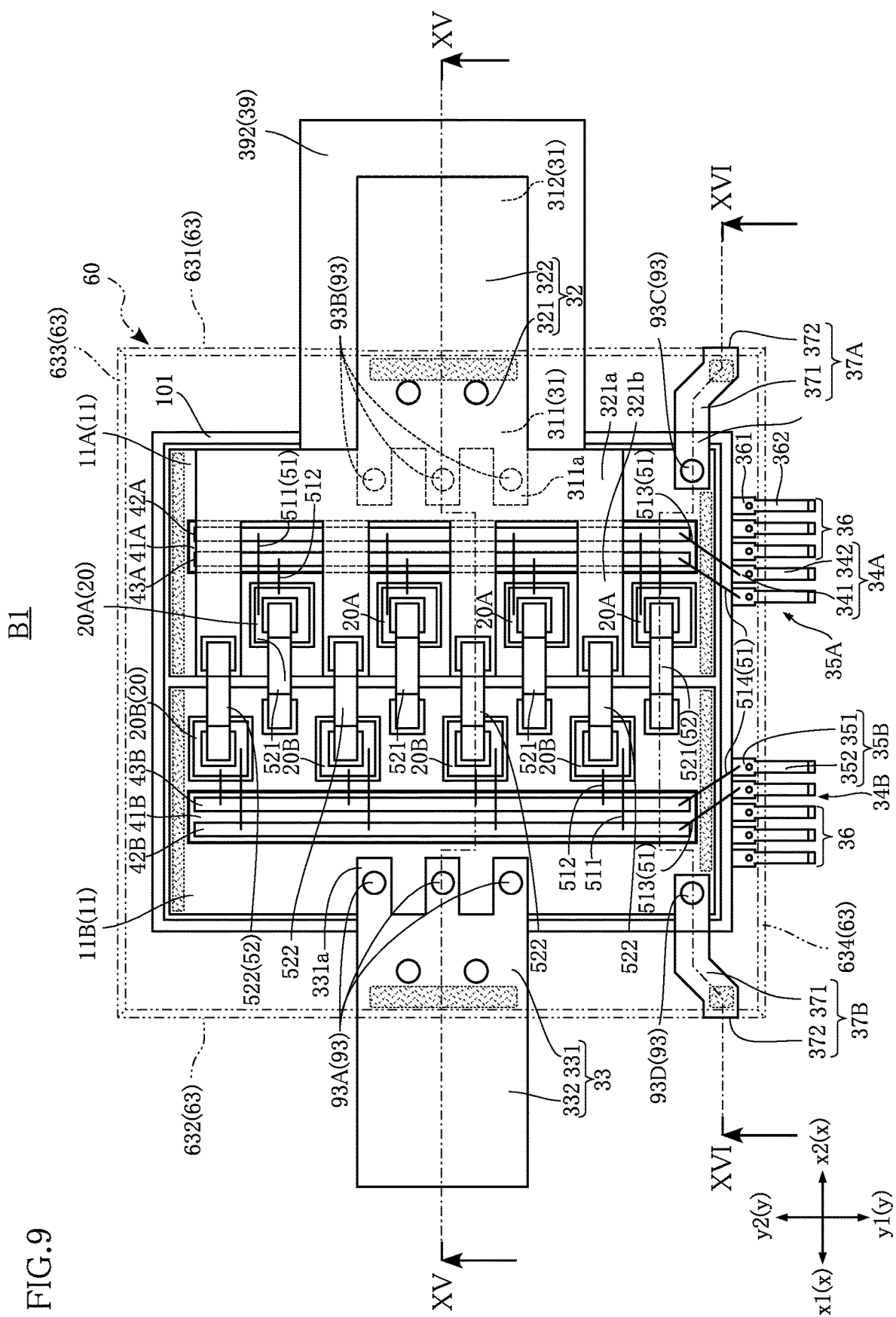
FIG. 9 is a plan view obtained by indicating the sealing resin in FIG. 8 with an imaginary line.
Figure 10:
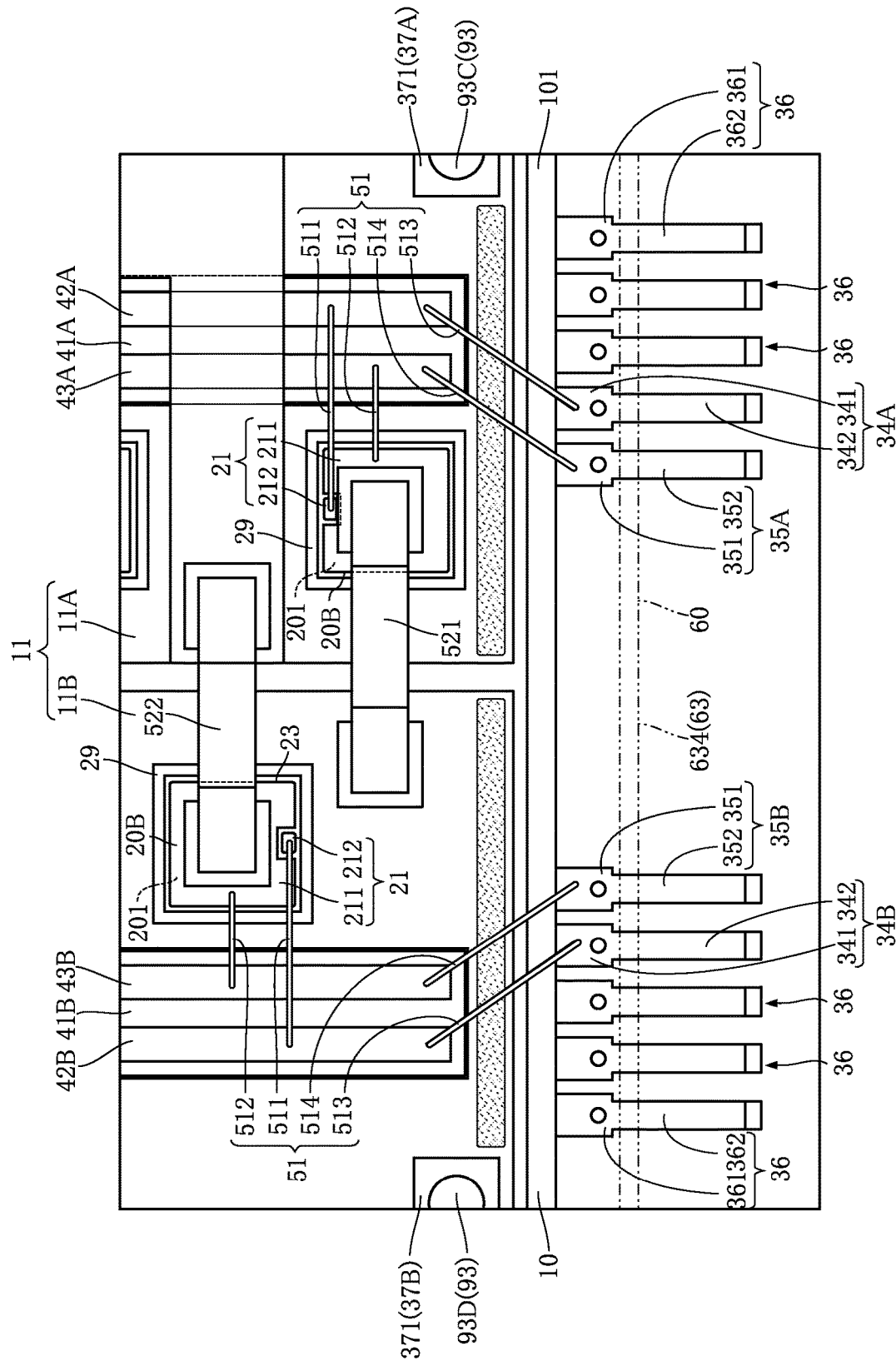
FIG. 10 is a partially enlarged view showing a part of FIG. 9.
Figure 11:
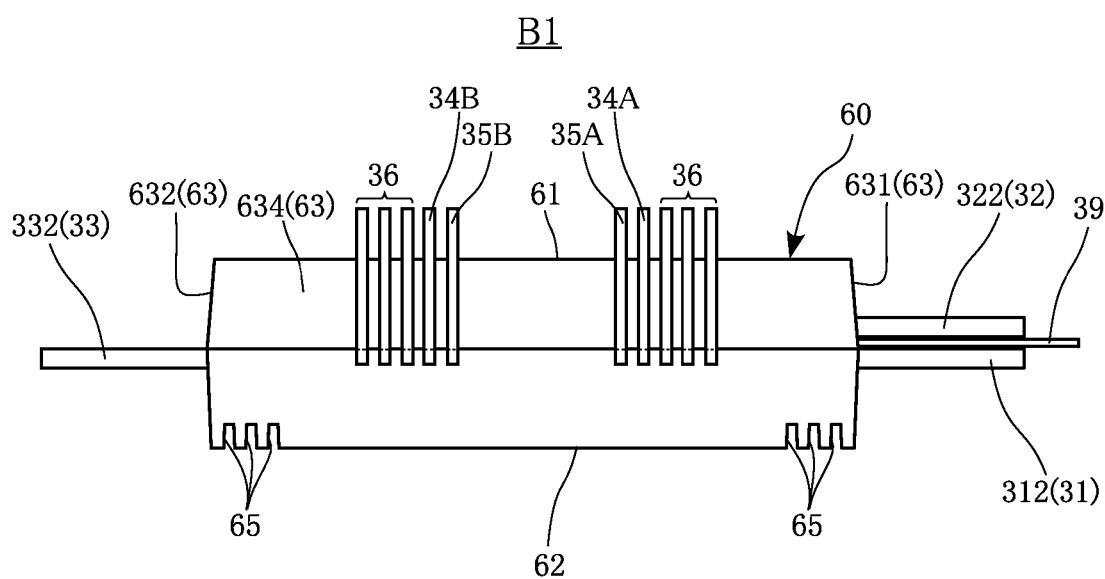
FIG. 11 is a front view showing the semiconductor device according to the first embodiment.
Figure 11:
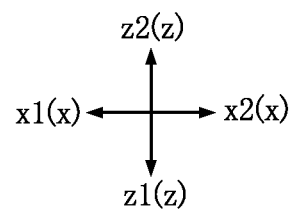
Figure 12:
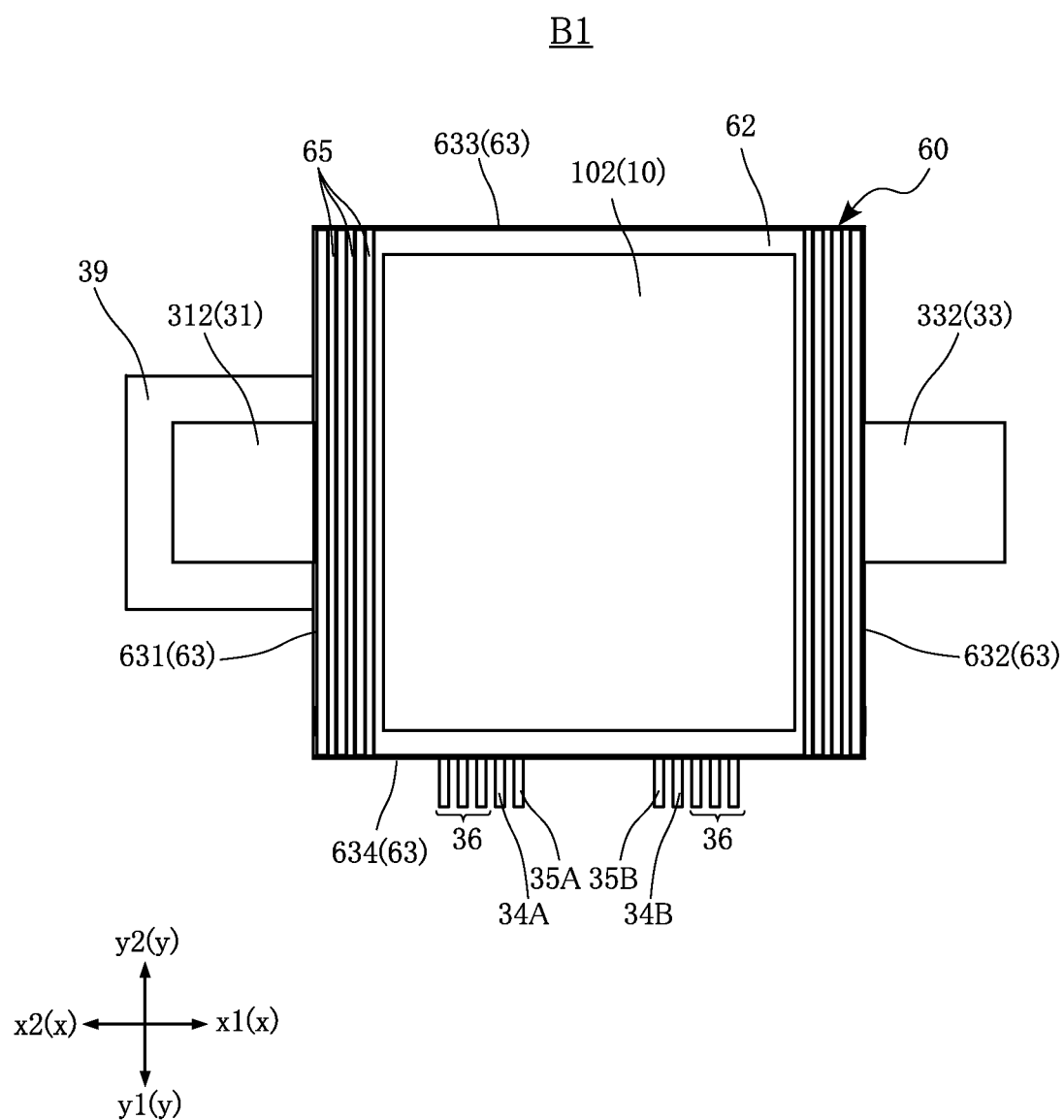
FIG. 12 is a bottom view showing the semiconductor device according to the first embodiment.
Figure 13:
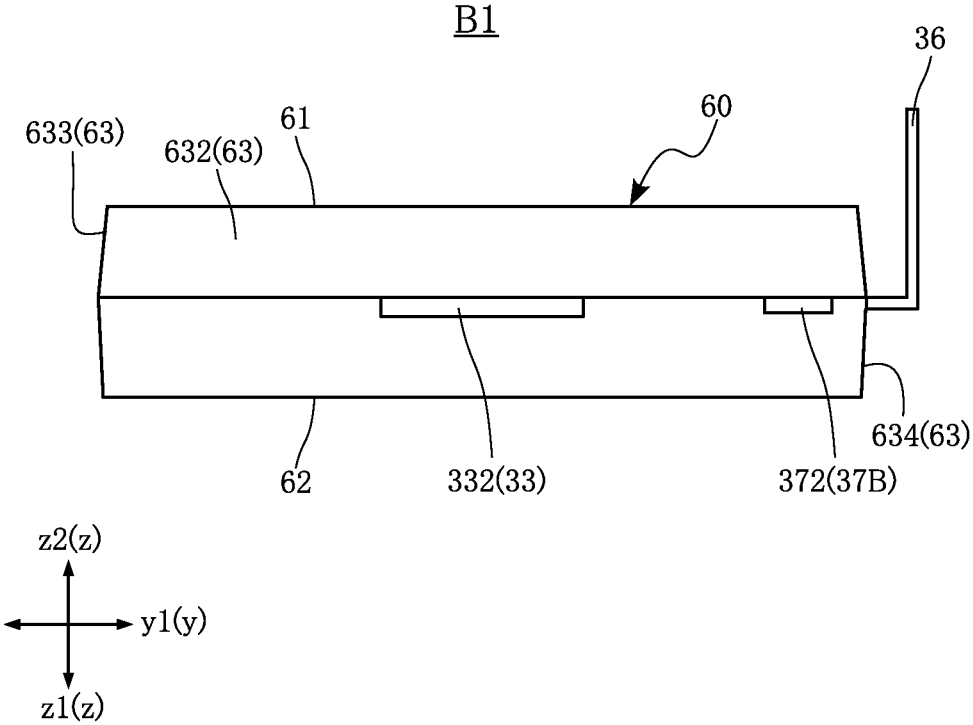
FIG. 13 is a left-side view showing the semiconductor device according to the first embodiment.
Figure 14:
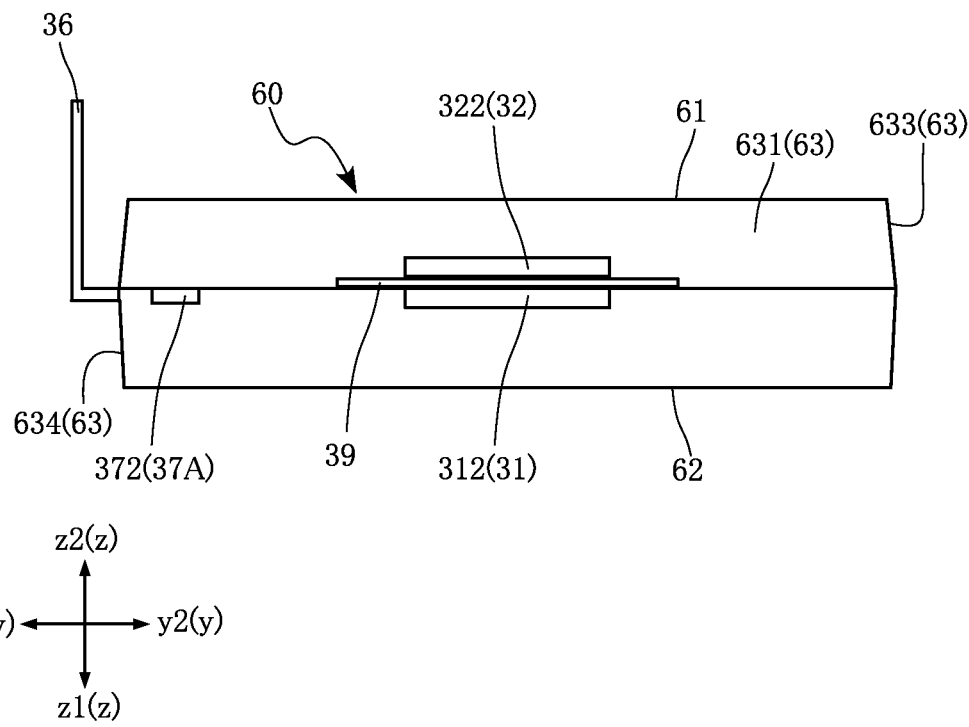
FIG. 14 is a right-side view showing the semiconductor device according to the first embodiment.
Figure 15:
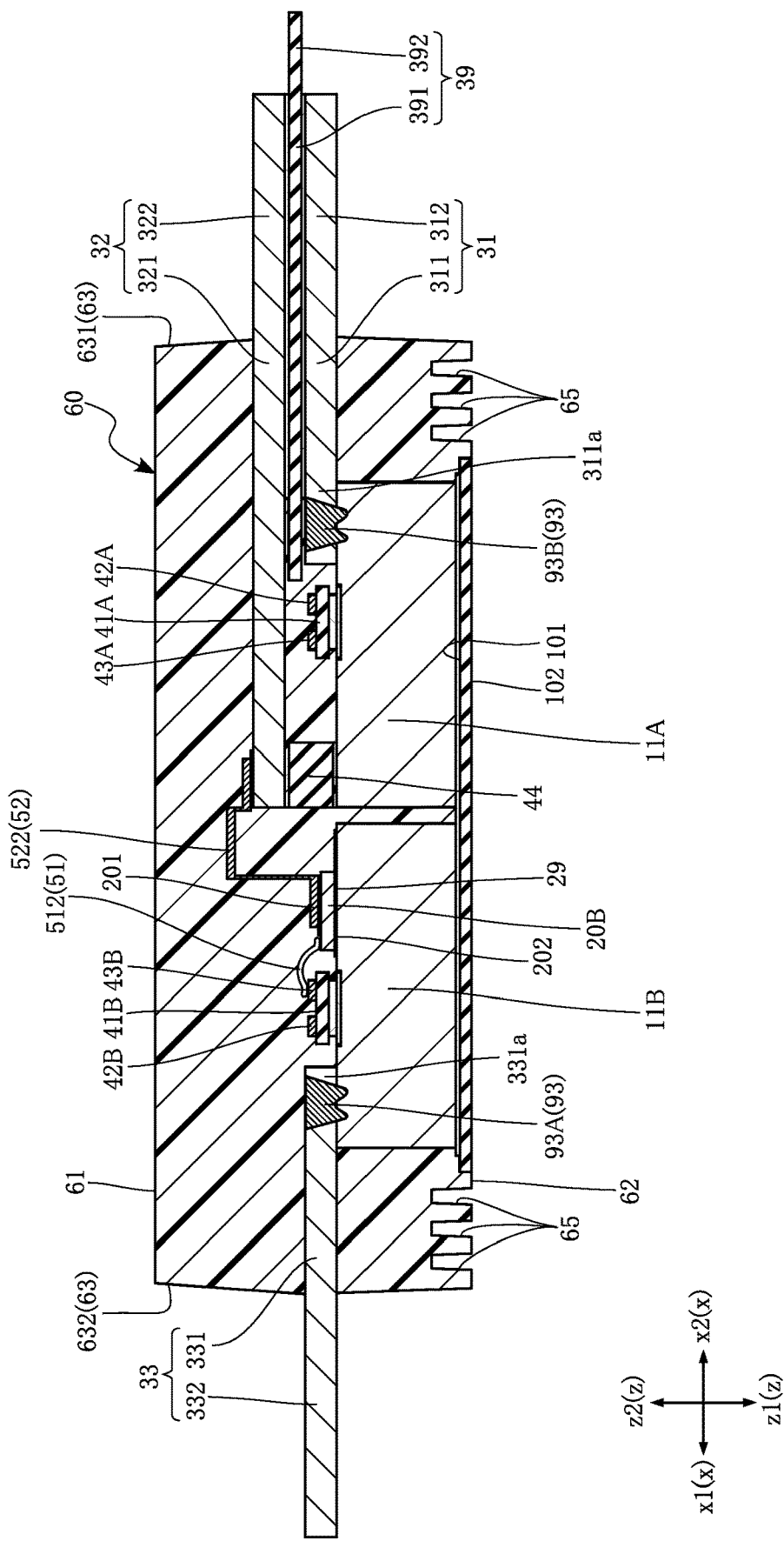
FIG. 15 is a cross-sectional view along line XV-XV in FIG. 9.
Figure 16:
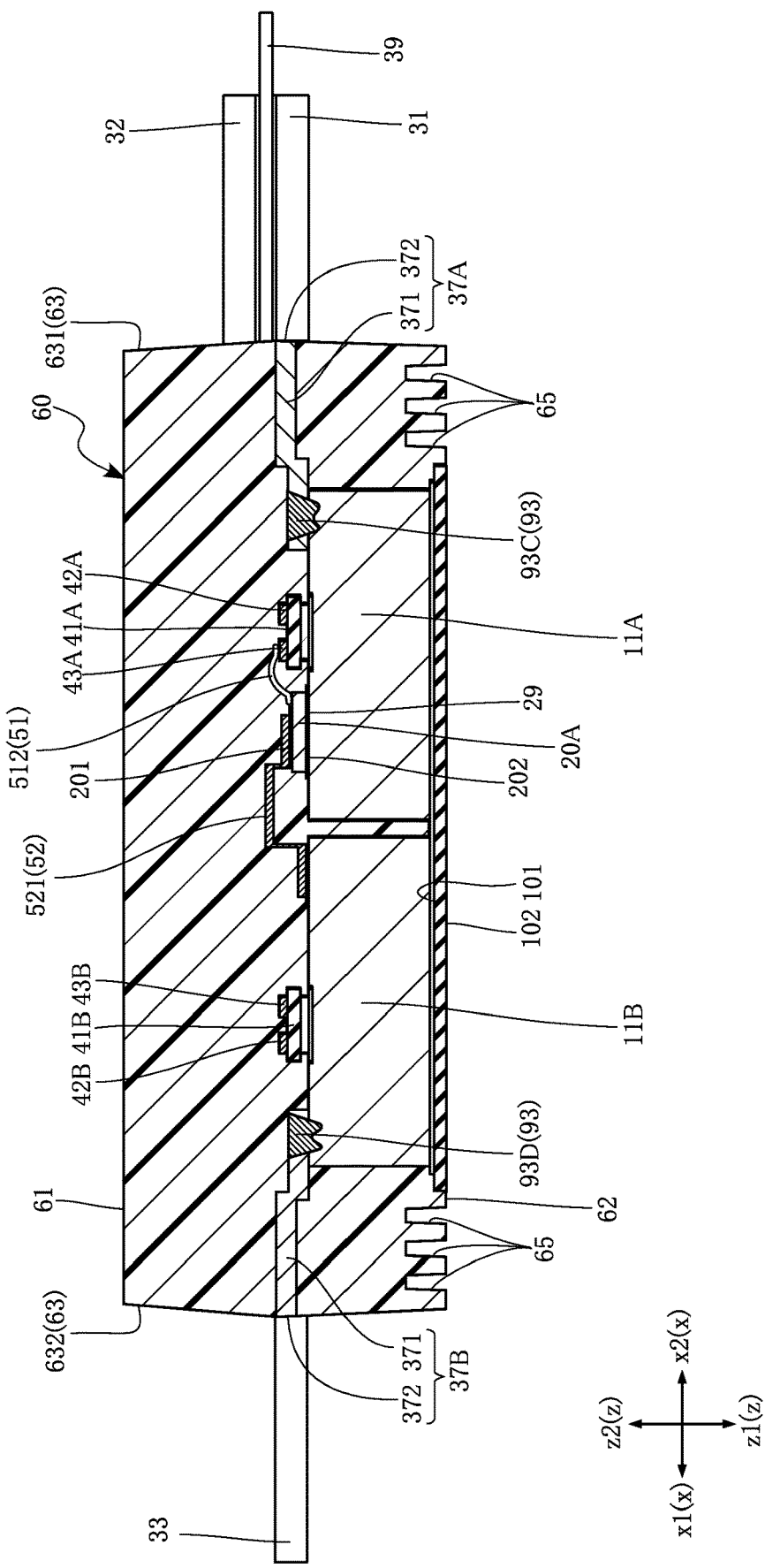
FIG. 16 is a cross-sectional view along line XVI-XVI in FIG. 9.
Figure 17:
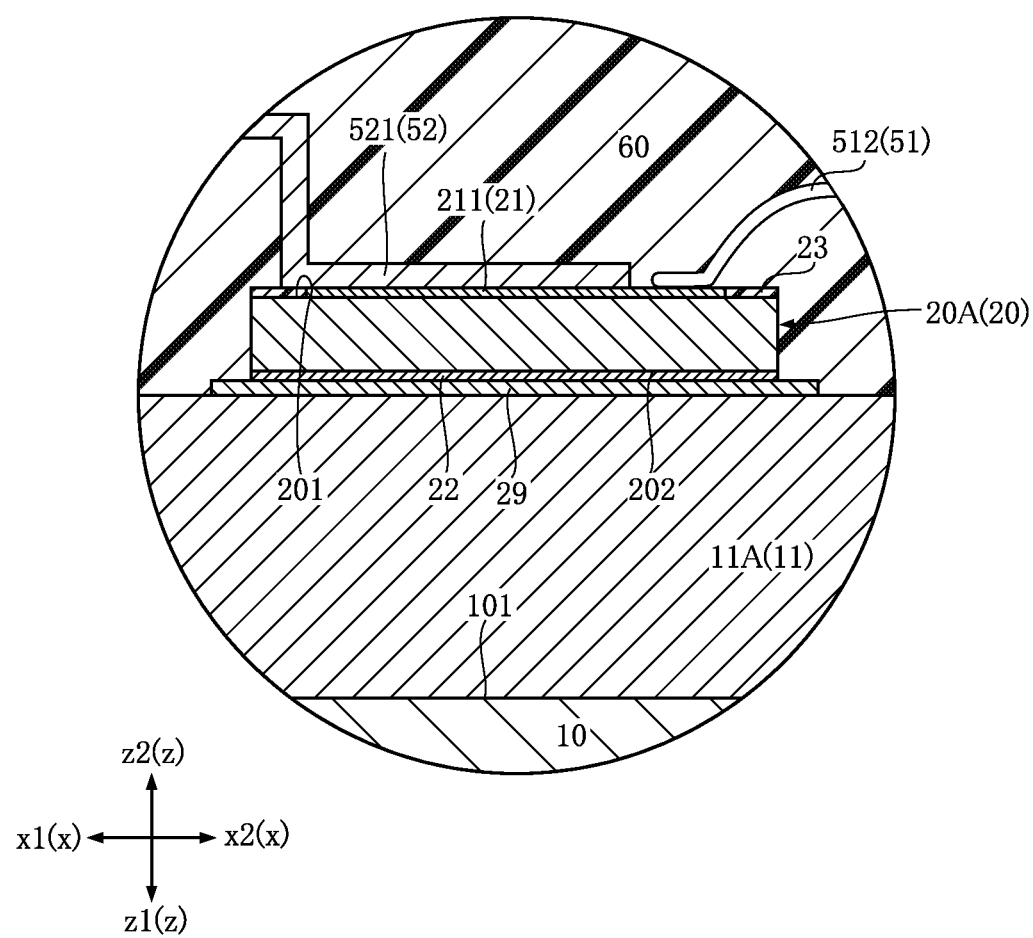
FIG. 17 is an enlarged cross-sectional view showing a main part in FIG. 16.

FIG. 6 is a perspective view showing the semiconductor device B1. FIG. 7 is a perspective view obtained by omitting the sealing resin 60 from FIG. 6. FIG. 8 is a plan view showing the semiconductor device B1. FIG. 9 is a plan view obtained by indicating the sealing resin 60 in FIG. 8 with an imaginary line (two-dot chain line). FIG. 10 is a partially enlarged view showing a part of the plan view shown in FIG. 9. FIG. 11 is a front view showing the semiconductor device B1. FIG. 12 is a bottom view showing the semiconductor device B1. FIG. 13 is a side view (left-side view) showing the semiconductor device B1. FIG. 14 is a side view (right-side view) showing the semiconductor device B1. FIG. 15 is a cross-sectional view along line XV-XV in FIG. 9. FIG. 16 is a cross-sectional view along line XVI-XVI in FIG. 9. FIG. 17 is an enlarged cross-sectional view in which a main part in FIG. 16 is enlarged, and shows the sectional structure of the switching elements 20.

For convenience of explanation, three directions that are perpendicular to each other in FIGS. 6 to 17 are defined as x direction, y direction, and z direction. The z direction is the thickness direction of the semiconductor device B1, and corresponds to the thickness direction of the joint structure A1. The x direction is the horizontal direction in the plan views (see FIGS. 8 and 9) of the semiconductor device B1. The y direction is the vertical direction in the plan views (see FIGS. 8 and 9) of the semiconductor device B1. As the need arises, one side in the x direction is referred to as x1 direction, and the other side in the x direction as x2 direction. Similarly, one side in the y direction is referred to as y1 direction, the other side in the y direction as y2 direction, one side in the z direction as z1 direction, and the other side in the z direction as z2 direction.

As shown in FIGS. 7, 9, 15 and 16, the plurality of conductive members 11 are arranged on the insulating substrate 10. The insulating substrate 10 serves as a supporting member for the plurality of conductive members 11 and the plurality of switching elements 20. The insulating substrate 10 is electrically insulative. The insulating substrate 10 is made of a ceramic material having a high thermal conductivity, for example. One example of such a ceramic material is AlN (aluminum nitride). In the present embodiment, the insulating substrate 10 has a rectangular shape in plan view. As shown in FIGS. 15 and 16, the insulating substrate 10 has an obverse surface 101 and a reverse surface 102.

The obverse surface 101 and the reverse surface 102 are separated apart and face away from each other in the z direction. The obverse surface 101 faces in the z2 direction, which is the side in the z direction in which the plurality of conductive members 11 are arranged. The obverse surface 101 is covered with the sealing resin 60, together with the plurality of conductive members 11 and the plurality of switching elements 20. The reverse surface 102 faces in the z1 direction. As shown in FIGS. 12, 15, and 16, the reverse surface 102 is exposed from the sealing resin 60. The reverse surface 102 is connected to a heat sink (not shown), for example. The structure of the insulating substrate 10 is not limited to the above example. For example, the insulating substrate 10 can be provided individually for each of the plurality of conductive members 11.

Each of the plurality of conductive members 11 is a metal plate. The metal plate is made of Cu or a Cu alloy, for example. The plurality of conductive members 11, as well as the two input terminals 31, 32 and the output terminal 33, constitute a conductive path with the plurality of switching elements 20. The plurality of conductive members 11 are arranged apart from each other on the obverse surface 101 of the insulating substrate 10. Each of the conductive members 11 is joined to the obverse surface 101 via a joining material such as Ag (silver) paste. The dimension of each conductive member 11 in the z direction is 3.0 mm, for example, but it is not limited to this. The plurality of conductive members 11 may be covered with Ag plating.

The plurality of conductive members 11 include two conductive members 11A and 11B. As shown in FIGS. 7 and 9, the conductive member 11A is offset further in the x2 direction than the conductive member 11B. The plurality of switching elements 20A are mounted on the conductive member 11A. The plurality of switching elements 20B are mounted on the conductive member 11B. Each of the two conductive members 11A and 11B has a rectangular shape in plan view, for example. Each of the conductive members 11A and 11B may be formed with a groove in a part of the surface facing in the z2 direction. For example, the conductive member 11A may be formed with a groove extending in the y direction between the plurality of switching elements 20A and the insulating layer 41A (described below) in plan view. Similarly, the conductive member 11B may be formed with a groove extending in the y direction between the plurality of switching elements 20B and the insulating layer 41B (described below) in plan view.

Each of the conductive members 11A and 11B includes a rough area at a part of its surface (the surface facing in the z2 direction). In FIGS. 9 and 10, the rough areas are indicated by hatching. Each of the rough areas has a rough surface as compared to the other parts of the surfaces of the conductive members 11. The rough areas are formed by irradiating the surfaces of the conductive members 11 with a laser beam during the manufacturing process of the semiconductor device B1. Specifically, the rough surfaces are created by irradiating the surfaces of the conductive members 11 with a laser beam to melt the parts irradiated with the laser beam, and letting the melted parts solidify. Note that the parts irradiated with the laser beam may be partially sublimated. The rough areas can increase the joining strength with the sealing resin 60 by an anchor effect. Each of the conductive members 11A and 11B may not include any rough areas.

The structure of the plurality of conductive members 11 is not limited to the above example, and may be changed as appropriate according to the performance required for the semiconductor device B1. For example, the shape, size, arrangement, etc., of each conductive member 11 may be changed based on the number, arrangement, etc., of the plurality of switching elements 20.

Each of the plurality of switching elements 20 is a metal-oxide-semiconductor field-effect transistor (MOSFET) that is made of a semiconductor material mainly containing silicon carbide (SiC). The plurality of switching elements 20 are not limited to MOSFETs, and may be field effect transistors including metal-insulator-semiconductor FETs (MISFETs), bipolar transistors such as insulated gate bipolar transistors (IGBTs), and IC chips such as LSIs. Each of the switching elements 20 is the same element, and is an n-channel MOSFET. Each of the switching elements 20 is rectangular in plan view, for example, but it is not limited to this.

As shown in FIG. 17, each of the plurality of switching elements 20 has an element obverse surface 201 and an element reverse surface 202. FIG. 17 shows a switching element 20A. The element obverse surface 201 and the element reverse surface 202 are separated apart and face away from each other in the z direction. The element obverse surface 201 faces in the same direction as the obverse surface 101 of the insulating substrate 10. The element reverse surface 202 faces the obverse surface 101 of the insulating substrate 10.

As shown in FIG. 17, each of the plurality of switching elements 20 has an obverse-surface electrode 21, a reverse-surface electrode 22, and an insulating film 23.

The obverse-surface electrode 21 is provided on the element obverse surface 201. As shown in FIG. 10, the obverse-surface electrode 21 includes a first electrode 211 and a second electrode 212. The first electrode 211 is a source electrode, for example, through which a source current flows. The second electrode 212 is a gate electrode, for example, to which a gate voltage for driving the switching element 20 is applied. The first electrode 211 is larger than the second electrode 212. Although the first electrode 211 is configured to have a single area in the example shown in FIG. 10, it may have a plurality of areas instead.

The reverse-surface electrode 22 is provided on the element reverse surface 202. For example, the reverse-surface electrode 22 is formed over the entirety of the element reverse surface 202. The reverse-surface electrode 22 is a drain electrode, for example, through which a drain current flows.

The insulating film 23 is provided on the element obverse surface 201. The insulating film 23 is electrically insulative. The insulating film 23 surrounds the obverse-surface electrode 21 in plan view. For example, the insulating film 23 is formed by stacking a silicon dioxide ($SiO_2$) layer, a silicon nitride ($SiN_4$) layer, and a polybenzoxazole layer in the stated order from the element obverse surface 201. Note that the insulating film 23 may include a polyimide layer instead of the polybenzoxazole layer.

As described above, the plurality of switching elements 20 include the plurality of switching elements 20A and the plurality of switching elements 20B. As shown in FIGS. 7 and 9, the semiconductor device B1 includes four switching elements 20A and four switching elements 20B. The number of the plurality of switching elements 20 is not limited to the above example, and may be changed as appropriate according to the performance required for the semiconductor device B1. For example, if the semiconductor device B1 is a half-bridge switching circuit, the plurality of switching elements 20A constitute an upper arm circuit of the semiconductor device B1, and the plurality of switching elements 20B constitute a lower arm circuit of the semiconductor device B1.

As shown in FIG. 9, the plurality of switching elements 20A are mounted on the conductive member 11A. The plurality of switching elements 20A are aligned and separated apart from each other in the y direction. As shown in FIG. 17, each of the switching elements 20A is conductively bonded to the conductive member 11A via a conductive bonding layer 29. The conductive bonding layer 29 is made of lead-free solder that mainly contains tin (Sn), for example, but it is not limited to this and may be made of Ag paste instead. The element reverse surface 202 of each switching element 20A faces the upper surface (the surface facing in the z2 direction) of the conductive member 11A. The reverse-surface electrode 22 of each switching element 20A is electrically connected to the conductive member 11A via the conductive bonding layer 29.

As shown in FIG. 9, each of the plurality of switching elements 20B is mounted on the conductive member 11B. The plurality of switching elements 20B are aligned and separated apart from each other in the y direction. Each of the switching elements 20B is conductively bonded to the conductive member 11B via the conductive bonding layer 29. The element reverse surface 202 of each switching element 20B faces the upper surface (the surface facing in the z2 direction) of the conductive member 11B. The reverse-surface electrode 22 of each switching element 20A is electrically connected to the conductive member 11B via the conductive bonding layer 29.

Each of the two input terminals 31 and 32 is a metal plate. The metal plate is made of Cu or a Cu alloy, for example. The dimension of each of the two input terminals 31 and 32 in the z direction is 0.8 mm, for example, but it is not limited to this. As shown in FIG. 11, each of the two input terminals 31 and 32 is arranged at a position offset in the x2 direction in the semiconductor device B1. A source voltage, for example, is applied between the two input terminals 31 and 32. The input terminal 31 is a positive electrode (P terminal), and the input terminal 32 is a negative electrode (N terminal). The input terminal 32 is arranged to be separated apart from both of the input terminal 31 and the conductive member 11A in the z direction.

As shown in FIGS. 9 and 15, the input terminal 31 has a pad portion 311 and a terminal portion 312.

The pad portion 311 is a part of the input terminal 31 covered with the sealing resin 60. The end of the pad portion 311 in the x1 direction has a comb-like shape, and includes a plurality of comb-tooth portions 311a. Each of the plurality of comb-tooth portions 311a is joined to the surface of the conductive member 11A via some of the welded portions 93 (specifically, input-terminal joining portions 93B described below), and the input terminal 31 and the conductive member 11A are electrically connected via the welded portions 93. The comb-tooth portions 311a and the conductive member 11A are joined by laser welding.

The terminal portion 312 is a part of the input terminal 31 exposed from the sealing resin 60. As shown in FIGS. 9 and 15, the terminal portion 312 extends from the sealing resin 60 in the x2 direction in plan view.

As shown in FIGS. 9 and 15, the input terminal 32 has a pad portion 321 and a terminal portion 322.

The pad portion 321 is a part of the input terminal 32 covered with the sealing resin 60. The pad portion 321 includes a connecting portion 321a and a plurality of extended portions 321b. The connecting portion 321a has a band shape extending in the y direction. The connecting portion 321a is connected to the terminal portion 322. Each of the plurality of extended portions 321b has a band shape extending from the connecting portion 321a in the x1 direction. The plurality of extended portions 321b are aligned and separated apart from each other in the y direction in plan view. Each of the extended portions 321b has the surface that faces in the z1 direction and that is in contact with the corresponding base portion 44. Each of the extended portions 321b is supported by the conductive member 11A via the corresponding base portion 44.

The pad portion 321 includes a rough area at a part of its surface. In FIG. 9, the rough area is indicated by hatching. The rough area has a rough surface as compared to the other parts of the surface of the pad portion 321. The rough area is formed by irradiating the surface of the input terminal 32 with a laser beam during the manufacturing process of the semiconductor device B1. The rough area can increase the joining strength with the sealing resin 60 by an anchor effect. The pad portion 321 may not include any rough area.

The terminal portion 322 is part of the input terminal 32 exposed from the sealing resin 60. As shown in FIGS. 9 and 15, the terminal portion 322 extends from the sealing resin 60 in the x2 direction in plan view. The terminal portion 322 is rectangular in plan view. As shown in FIGS. 9 and 15, the terminal portion 322 overlaps with the terminal portion 312 of the input terminal 31 in plan view. The terminal portion 322 is separated apart from the terminal portion 312 in the z2 direction. In the examples shown in FIGS. 9 and 15, the terminal portion 322 has the same shape as the terminal portion 312.

The output terminal 33 is a metal plate. The metal plate is made of Cu or a Cu alloy, for example. As shown in FIG. 11, the output terminal 33 is arranged at a position offset in the x1 direction in the semiconductor device B1. AC power (voltage) resulting from power conversion by the plurality of switching elements 20 is output from the output terminal 33.

As shown in FIGS. 9 and 15, the output terminal 33 includes a pad portion 331 and a terminal portion 332.

The pad portion 331 is a part of the output terminal 33 covered with the sealing resin 60. The end of the pad portion 331 in the x2 direction has a comb-like shape, and includes a plurality of comb-tooth portions 331a. Each of the plurality of comb-tooth portions 331a is joined to the surface of the conductive member 11B via some of the welded portions 93 (specifically, output-terminal joining portions 93A described below), and the output terminal 33 and the conductive member 11B are electrically connected via the welded portions 93. The comb-tooth portions 331a and the conductive member 11B are joined by laser welding.

The pad portion 331 includes a rough area at a part of its surface. In FIG. 9, the rough area is indicated by hatching. The rough area has a rough surface as compared to the other parts of the surface of the pad portion 331. The rough area is formed by irradiating the surface of the output terminal 33 with a laser beam during the manufacturing process of the semiconductor device B1. The rough area can increase the joining strength with the sealing resin 60 by an anchor effect. The pad portion 331 may not include any rough area.

The terminal portion 332 is a part of the output terminal 33 exposed from the sealing resin 60. As shown in FIGS. 9 and 15, the terminal portion 332 extends from the sealing resin 60 in the x1 direction.

As shown in FIGS. 8 to 10, and FIG. 12, the pair of gate terminals 34A and 34B are located adjacent to the conductive members 11A and 11B in the y direction. A gate voltage for driving the plurality of switching elements 20A is applied to the gate terminal 34A. A gate voltage for driving the plurality of switching elements 20B is applied to the gate terminal 34B.

As shown in FIGS. 9 and 10, each of the pair of gate terminals 34A and 34B has a pad portion 341 and a terminal portion 342. The pad portion 341 of each of the gate terminals 34A and 34B is covered with the sealing resin 60. As such, the gate terminals 34A and 34B are supported by the sealing resin 60. The surface of each pad portion 341 may be provided with Ag plating, for example. Each of the terminal portions 342 is connected to the corresponding pad portion 341 and exposed from the sealing resin 60. Each of the terminal portions 342 is L-shaped as viewed in the x direction.

As shown in FIGS. 8 to 10, and FIG. 12, the pair of detection terminals 35A and 35B are located adjacent to the pair of gate terminals 34A and 34B in the x direction. The voltage (voltage corresponding to the source current) applied to the obverse-surface electrode 21 (first electrode 211) of each of the plurality of switching elements 20A is detected from the detection terminal 35A. The voltage (voltage corresponding to the source current) applied to the obverse-surface electrode 21 (first electrode 211) of each of the plurality of switching elements 20B is detected from the detection terminal 35B.

As shown in FIGS. 9 and 10, each of the pair of detection terminals 35A and 35B has a pad portion 351 and a terminal portion 352. The pad portion 351 of each of the detection terminals 35A and 35B is covered with the sealing resin 60. As such, the detection terminals 35A and 35B are supported by the sealing resin 60. The surface of each pad portion 351 may be provided with Ag plating, for example. Each of the terminal portions 352 is connected to the corresponding pad portion 351 and exposed from the sealing resin 60. Each of the terminal portions 352 is L-shaped as viewed in the x direction.

As shown in FIGS. 8 to 10, and FIG. 12, the plurality of dummy terminals 36 are positioned on the opposite side of the pair of gate terminals 34A and 34B in the x direction from the pair of detection terminals 35A and 35B. In the present embodiment, six dummy terminals 36 are provided. Three of the six dummy terminals 36 are positioned offset in one side in the x direction (x2 direction). The other three of the six dummy terminals 36 are positioned offset in the other side in the x direction (x1 direction). The number of the plurality of dummy terminals 36 is not limited to the example above. Alternatively, the plurality of dummy terminals 36 may not be provided at all.

As shown in FIGS. 9 and 10, each of the plurality of dummy terminals 36 has a pad portion 361 and a terminal portion 362. The pad portion 361 of each dummy terminal 36 is covered with the sealing resin 60. As such, the dummy terminals 36 are supported by the sealing resin 60. The surface of each pad portion 361 may be provided with Ag plating, for example. Each of the terminal portions 362 is connected to the corresponding pad portion 361 and exposed from the sealing resin 60. Each of the terminal portions 362 is L-shaped as viewed in the x direction. In the examples shown in FIGS. 6 to 14, the terminal portions 362 have the same shape as the terminal portions 342 of the pair of gate terminals 34A and 34B and the terminal portions 352 of the pair of detection terminals 35A and 35B.

As shown in FIGS. 7, 9, and 16, in plan view, the pair of side terminals 37A and 37B are positioned at crossing areas of the edge portion of the sealing resin 60 offset in the y1 direction and the edge portions of the sealing resin 60 spaced apart from each other in the x direction. As shown in FIGS. 9 and 16, each of the pair of side terminals 37A and 37B has a pad portion 371 and an end face 372.

The pad portion 371 of each of the side terminals 37A and 37B is covered with the sealing resin 60. As shown in FIG. 9, a part of each pad portion 371 is bent in plan view. As shown in FIG. 16, another part of each pad portion 371 is bent in the z direction. The pad portion 371 of the side terminal 37A is joined to the conductive member 11A via one of the welded portions 93 (specifically, a side-terminal joining portion 93D described below), and the pad portion 371 of the side terminal 37B is joined to the conductive member 11B via one of the welded portions 93 (specifically, a side-terminal joining portion 93C described below). As such, the side terminal 37A is supported by the conductive member 11A, and the side terminal 37B is supported by the conductive member 11B.

Each of the pad portions 371 includes a rough area at a part of its surface. In FIG. 9, the rough area is indicated by hatching. The rough area has a rough surface as compared to the other parts of the surface of each pad portion 371. The rough area is formed by irradiating the surfaces of the pair of side terminals 37A and 37B with a laser beam during the manufacturing process of the semiconductor device B1. The rough area can increase the joining strength with the sealing resin 60 by an anchor effect. Each of the side terminals 37A and 37B may not include any rough areas.

The end face 372 of each of the side terminals 37A and 37B is exposed from the sealing resin 60. The end face 372 of the side terminal 37A faces in the x2 direction, and is substantially flush with a resin side surface 631, for example. Note that the end face 372 may not necessarily be flush. The end face 372 of the side terminal 37B faces in the x1 direction, and is substantially flush with a resin side surface 632, for example. Note that the end face 372 may not necessarily be flush. Entirety of each of the side terminals 37A and 37B overlaps with the sealing resin 60 in plan view.

The structure of each of the side terminals 37A and 37B is not limited to the above example. For example, the side terminals 37A and 37B may extend out of the resin side surfaces 631 and 632 in plan view. Also, the semiconductor device B1 may not include the side terminals 37A and 37B.

As shown in FIGS. 8 to 10, the pair of gate terminals 34A and 34B, the pair of detection terminals 35A and 35B, and the plurality of dummy terminals 36 are arranged along the x direction in plan view. In the semiconductor device B1, the pair of gate terminals 34A and 34B, the pair of detection terminals 35A and 35B, the plurality of dummy terminals 36, and the pair of side terminals 37A and 37B are all formed from the same lead frame.

An insulating member 39 is electrically insulative, and is made of an insulating sheet, for example. As shown in FIG. 15, a part of the insulating member 39 is a flat plate and disposed between the terminal portion 312 of the input terminal 31 and the terminal portion 322 of the input terminal 32 in the z direction. In plan view, the entirety of the input terminal 31 overlaps with the insulating member 39. As for the input terminal 32, a part of the pad portion 321 and the entirety of the terminal portion 322 overlap with the insulating member 39 in plan view. The insulating member 39 insulates the two input terminals 31 and 32 from each other. A part (which is offset in the x1 direction) of the insulating member 39 is covered with the sealing resin 60.

As shown in FIG. 15, the insulating member 39 has an intervening portion 391 and an extended portion 392. The intervening portion 391 is interposed between the terminal portion 312 of the input terminal 31 and the terminal portion 322 of the input terminal 32 in the z direction. The entirety of the intervening portion 391 is disposed between the terminal portion 312 and the terminal portion 322. The extended portion 392 extends further from the intervening portion 391 in the x2 direction than the terminal portions 312 and 322.

The pair of insulating layers 41A and 41B are electrically insulative, and are made of a glass epoxy resin, for example. As shown in FIG. 9, each of the pair of insulating layers 41A and 41B has a band shape extending in the y direction. As shown in FIGS. 9, 10, 15 and 16, the insulating layer 41A is joined to the upper surface (the surface facing in the z2 direction) of the conductive member 11A. The insulating layer 41A is offset further in the x2 direction than the plurality of switching elements 20A. As shown in FIGS. 9, 10, 15 and 16, the insulating layer 41B is joined to the upper surface (the surface facing in the z2 direction) of the conductive member 11B. The insulating layer 41B is offset further in the x1 direction than the plurality of switching elements 20B.

The pair of gate layers 42A and 42B are electrically conductive, and are made of Cu, for example. As shown in FIG. 9, each of the pair of gate layers 42A and 42B has a band shape extending in the y direction. As shown in FIGS. 9, 10, 15 and 16, the gate layer 42A is provided on the insulating layer 41A. The gate layer 42A is electrically connected to the second electrodes 212 (gate electrodes) of the respective switching elements 20A via the linear connecting members 51 (specifically, gate wires 511 described below). As shown in FIGS. 9, 10, 15 and 16, the gate layer 42B is provided on the insulating layer 41B. The gate layer 42B is electrically connected to the second electrodes 212 (gate electrodes) of the respective switching elements 20B via the linear connecting members 51 (specifically, gate wires 511 described below).

The pair of detection layers 43A and 43B are electrically conductive, and are made of Cu, for example. As shown in FIG. 9, each of the pair of pair of detection layers 43A and 43B has a band shape extending in the y direction. As shown in FIGS. 9, 10, 15 and 16, the detection layer 43A is provided on the insulating layer 41A, together with the gate layer 42A. The detection layer 43A is located adjacent to the gate layer 42A with a space therefrom on the insulating layer 41A. The detection layer 43A is positioned closer to the plurality of switching elements 20A (in the x2 direction) than is the gate layer 42A, but it can be positioned opposite from the plurality of switching elements 20A with respect to the gate layer 42A. The detection layer 43A is electrically connected to the first electrodes 211 (source electrodes) of the respective switching elements 20A via the linear connecting members 51 (specifically, detection wires 512 described below). As shown in FIGS. 9, 10, 15 and 16, the detection layer 43B is provided on the insulating layer 41B, together with the gate layer 42B. The detection layer 43B is located adjacent to the gate layer 42B with a space therefrom on the insulating layer 41B. The detection layer 43B is positioned closer to the plurality of switching elements 20B (in the x1 direction) than is the gate layer 42B, but it can be positioned opposite from the plurality of switching elements 20B with respect to the gate layer 42B. The detection layer 43B is electrically connected to the first electrodes 211 (source electrodes) of the respective switching elements 20B via the linear connecting members 51 (specifically, detection wires 512 described below).

Each of the plurality of base portions 44 is electrically insulative, and is made of a ceramic material, for example. As shown in FIGS. 7 and 15, each of the base portions 44 is joined to the surface of the conductive member 11A. Each base portion 44 is rectangular in plan view, for example. The plurality of base portions 44 are aligned and separated apart from each other in the y direction. The dimension of each base portion 44 in the z direction is substantially the same as the total of the dimension of the input terminal 31 in the z direction and the dimension of the insulating member 39 in the z direction. Each of the base portions 44 is joined to the corresponding extended portion 321b of the pad portion 321 of the input terminal 32. The base portions 44 support the input terminal 32.

The plurality of linear connecting members 51 are so-called bonding wires. Each of the plurality of linear connecting members 51 is electrically conductive, and is made of any one of aluminum (Al), gold (Au), and Cu, for example. As shown in FIGS. 9 and 10, the plurality of linear connecting members 51 include a plurality of gate wires 511, a plurality of detection wires 512, a pair of first connecting wires 513, and a pair of second connecting wires 514.

As shown in FIGS. 9 and 10, each of the plurality of gate wires 511 is joined to the second electrode 212 (gate electrode) of the corresponding switching element 20 at one end, and is joined to either the gate layer 42A or 42B at the other end. The plurality of gate wires 511 include those that electrically connect the second electrodes 212 of the switching elements 20A and the gate layer 42A, and those that electrically connect the second electrodes 212 of the switching elements 20B and the gate layer 42B.

As shown in FIGS. 9 and 10, each of the plurality of detection wires 512 is joined to the first electrode 211 (source electrode) of the corresponding switching element 20 at one end, and is joined to either the detection layer 43A or 43B at the other end. The plurality of detection wires 512 include those that electrically connect the first electrodes 211 of the switching elements 20A and the detection layer 43A, and those that electrically connect the first electrodes 211 of the switching elements 20B and the detection layer 43B.

As shown in FIGS. 9 and 10, one of the pair of first connecting wires 513 connects the gate layer 42A and the gate terminal 34A, and the other connects the gate layer 42B and the gate terminal 34B. One end of the one first connecting wire 513 is joined to the gate layer 42A, and the other end is joined to the pad portion 341 of the gate terminal 34A, so that the gate layer 42A and the gate terminal 34A are electrically connected to each other. One end of the other first connecting wire 513 is joined to the gate layer 42B and the other end is joined to the pad portion 341 of the gate terminal 34B, so that the gate layer 42B and the gate terminal 34B are electrically connected to each other.

As shown in FIGS. 9 and 10, one of the pair of second connecting wires 514 connects the detection layer 43A and the detection terminal 35A, and the other connects the detection layer 43B and the detection terminal 35B. One end of the one second connecting wire 514 is joined to the detection layer 43A, and the other is joined to the pad portion 351 of the detection terminal 35A, so that the detection layer 43A and the detection terminal 35A are electrically connected to each other. One end of the other second connecting wire 514 is joined to the detection layer 43B, and the other is joined to the pad portion 351 of the detection terminal 35B, so that the detection layer 43B and the detection terminal 35B are electrically connected to each other.

Each of the plurality of plate-like connecting members 52 is electrically conductive, and is made of any one of Al, Au, and Cu, for example. Each of the plate-like connecting members 52 may be formed by bending a metal plate. As shown in FIGS. 7, 9, and 10, the plurality of plate-like connecting members 52 include a plurality of first leads 521 and a plurality of second leads 522. Instead of the plurality of plate-like connecting members 52, bonding wires equivalent to the linear connecting members 51 described above may be used.

As shown in FIGS. 7, 9, and 10, each of the plurality of first leads 521 connects the corresponding switching element 20A and the conductive member 11B. Each of the first leads 521 is joined to the first electrode 211 (source electrode) of the corresponding switching element 20A at one end, and is joined to the surface of the conductive member 11B at the other end.

As shown in FIGS. 7, 9, and 10, each of the plurality of second leads 522 connects the corresponding switching element 20B and the input terminal 32. Each of the second leads 522 is joined to the first electrode 211 (source electrode) of the corresponding switching element 20B at one end, and is joined to the corresponding extended portion 321b of the pad portion 321 of the input terminal 32 at the other end. Each of the second leads 522 may be joined by Ag paste or solder, for example. Each of the second leads 522 is bent in the z direction.

As shown in FIGS. 15 and 16, the sealing resin 60 covers the insulating substrate 10 (except for the reverse surface 102), the plurality of conductive members 11, the plurality of switching elements 20, the plurality of linear connecting members 51, and the plurality of plate-like connecting members 52. The sealing resin 60 is made of epoxy resin, for example. As shown in FIGS. 6, 8, 9, and FIGS. 11 to 14, the sealing resin 60 has a resin obverse surface 61, a resin reverse surface 62, and a plurality of resin side surfaces 63.

The resin obverse surface 61 and the resin reverse surface 62 are separated apart and face away from each other in the z direction. The resin obverse surface 61 faces in the z2 direction, and the resin reverse surface 62 faces in the z1 direction. As shown in FIG. 12, the resin reverse surface 62 has a frame shape surrounding the reverse surface 102 of the insulating substrate 10 in plan view. Each of the plurality of resin side surfaces 63 is connected to and disposed between the resin obverse surface 61 and the resin reverse surface 62. The plurality of resin side surfaces 63 include a pair of resin side surfaces 631 and 632 separated apart from each other in the x direction, and a pair of resin side surfaces 633 and 634 separated apart from each other in the y direction. The resin side surface 631 faces in the x2 direction, and the resin side surface 632 faces in the x1 direction. The resin side surface 633 faces in the y2 direction, and the resin side surface 634 faces in the y1 direction.

As shown in FIGS. 6, 11, and 12, the sealing resin 60 includes a plurality of recesses 65 that are each recessed from the resin reverse surface 62 in the z direction. Each of the plurality of recesses 65 extends in the y direction, and continues from the edge of the resin reverse surface 62 in the y1 direction to the edge thereof in the y2 direction in plan view. The plurality of recesses 65 are formed such that, in plan view, three recesses 65 on the respective sides in the x direction flank the reverse surface 102 of the insulating substrate 10 in the x direction. The sealing resin 60 may not be formed with the plurality of recesses 65.

Each of the plurality of welded portions 93 is a portion that joins two metal members, and has the same structure (see FIGS. 1 and 2) as each of the welded portions 93 in the joint structure A1 described above. The plurality of welded portions 93 include a plurality of output-terminal joining portions 93A, a plurality of input-terminal joining portions 93B, and two side-terminal joining portions 93C and 93D.

As shown in FIGS. 9 and 15, each of the plurality of output-terminal joining portions 93A is a portion where a part of the output terminal 33 and a part of the conductive member 11B that overlap with each other in plan view are fused to each other by laser welding. The plurality of output-terminal joining portions 93A are formed, one on each comb-tooth portion 331a of the pad portion 331 of the output terminal 33 in plan view. The output-terminal joining portions 93A join the output terminal 33 as the first metal member 91 and the conductive member 11B as the second metal member 92, thereby forming a joint structure A1.

As shown in FIGS. 9 and 15, each of the plurality of input-terminal joining portions 93B is a portion where a part of the input terminal 31 and a part of the conductive member 11A that overlap with each other in plan view are fused to each other by laser welding. The plurality of input-terminal joining portions 93B are formed, one on each comb-tooth portion 311a of the pad portion 311 of the input terminal 31 in plan view. The input-terminal joining portions 93B join the input terminal 31 as the first metal member 91 and the conductive member 11A as the second metal member 92, thereby forming a joint structure A1.

As shown in FIGS. 9 and 16, the side-terminal joining portion 93C is a portion where a part of the side terminal 37A and a part of the conductive member 11A that overlap with each other in plan view are fused to each other by laser welding. The side-terminal joining portion 93C is formed on the pad portion 371 of the side terminal 37A in plan view. The side-terminal joining portion 93C joins the side terminal 37A as the first metal member 91 and the conductive member 11A as the second metal member 92, thereby forming a joint structure A1.

As shown in FIGS. 9 and 16, the side-terminal joining portion 93D is a portion where a part of the side terminal 37B and a part of the conductive member 11B that overlap with each other in plan view are fused to each other by laser welding. The side-terminal joining portion 93D is formed on the pad portion 371 of the side terminal 37B in plan view. The side-terminal joining portion 93D joins the side terminal 37B as the first metal member 91 and the conductive member 11B as the second metal member 92, thereby forming a joint structure A1.

Next, advantages of the joint structure A1, the joining method, and the semiconductor device B1 according to the first embodiment will be described.

The joint structure A1 includes the welded portion 93. The welded portion 93 is formed by fusing a part of the first metal member 91 and a part of the second metal member 92 in an area where the first metal member 91 and the second metal member 92 overlap with each other. The welded portion 93 is formed by laser welding, for example, and joins the first metal member 91 and the second metal member 92. Accordingly, the first metal member 91 and the second metal member 92 do not rub against each other. This suppresses the surface damage of the first metal member 91 and the second metal member 92.

In the joining method of the present embodiment, the first scan is performed by moving the laser beam along the first trajectory T1, and the second scan is performed by moving the reference position P3 of the first trajectory T1 along the second trajectory T2. In laser welding, it is known that spatters are reduced by increasing the irradiation speed of a laser beam and reducing the diameter of the laser beam. However, in the case of increasing the irradiation speed of a laser beam and reducing the diameter of the laser beam, heat generated by the laser beam may not be transferred from the first metal member 91 to the second metal member 92. As a result, the second metal member 92 may not melt, and the welded portion 93 may not be formed across the first metal member 91 and the second metal member 92. This means that the first metal member 91 and the second metal member 92 are not joined to each other. Accordingly, the first scan and the second scan described above are performed so that the laser beam forms a trajectory as shown in FIG. 5, for example. In this way, even if the irradiation speed of the laser beam is increased and the diameter of the laser beam is reduced, heat generated by the laser beam can be transferred sufficiently from the first metal member 91 to the second metal member 92. Thus, the joining method of the present embodiment can suppress the generation of spatters during laser welding, and can join the first metal member 91 and the second metal member 92.

In the joining method of the present embodiment, the radius R3 of the first trajectory T1 is substantially the same as the radius R4 of the second trajectory T2. For example, if the radius R3 of the first trajectory T1 is different from the radius R4 of the second trajectory T2, the trajectory (see FIG. 5) of the laser beam does not pass through the central portion (at and near the reference position P4 of the second trajectory T2) in plan view. Accordingly, setting the radius R3 of the first trajectory T1 to be substantially the same as the radius R4 of the second trajectory T2 can cause the trajectory of the laser beam to pass through the central portion in plan view, as shown in FIG. 5.

The semiconductor device B1 includes the plurality of welded portions 93. In other words, the metal members are joined by the welded portions 93 formed by laser welding. As such, the metal members do not rub against each other. In the ultrasonic welding described above, two joined metal members rub against each other, and therefore dust may be generated due to the wear of the metal members. If the dust is generated during the manufacturing process of the semiconductor device B1, it causes a malfunction of the semiconductor device B1. Accordingly, joining two metal members by laser welding can suppress malfunctions of the semiconductor device B1. In the case of laser welding, the heat generated during welding tends to diffuse locally. For example, when the pad portion 331 of the output terminal 33 and the conductive member 11B are joined by laser welding, the heat generated by the laser welding does not diffuse to the conductive bonding layer 29 formed on the conductive member 11B. As such, the diffusion of heat to the conductive bonding layer 29, for example, is suppressed. Since the conductive bonding layer 29, for example, is suppressed from melting against intention during the manufacturing process of the semiconductor device B1, the joint failures of the plurality of switching elements 20 can be prevented.

In the semiconductor device B1, the plurality of welded portions 93 are formed by the above joining method. As described above, the joining method can suppress the generation of spatters. If spatters are generated during the manufacturing process of the semiconductor device B1, they may cause a malfunction of the semiconductor device B1. Accordingly, forming the plurality of welded portions 93 with the above joining method can suppress malfunctions of the semiconductor device B1.

The semiconductor device B1 includes the insulating member 39 between the terminal portion 312 of the input terminal 31 and the terminal portion 322 of the input terminal 32 in the z direction. This makes it possible to easily form a laminated wire with the terminal portions 312 and 322.

Figure 18:
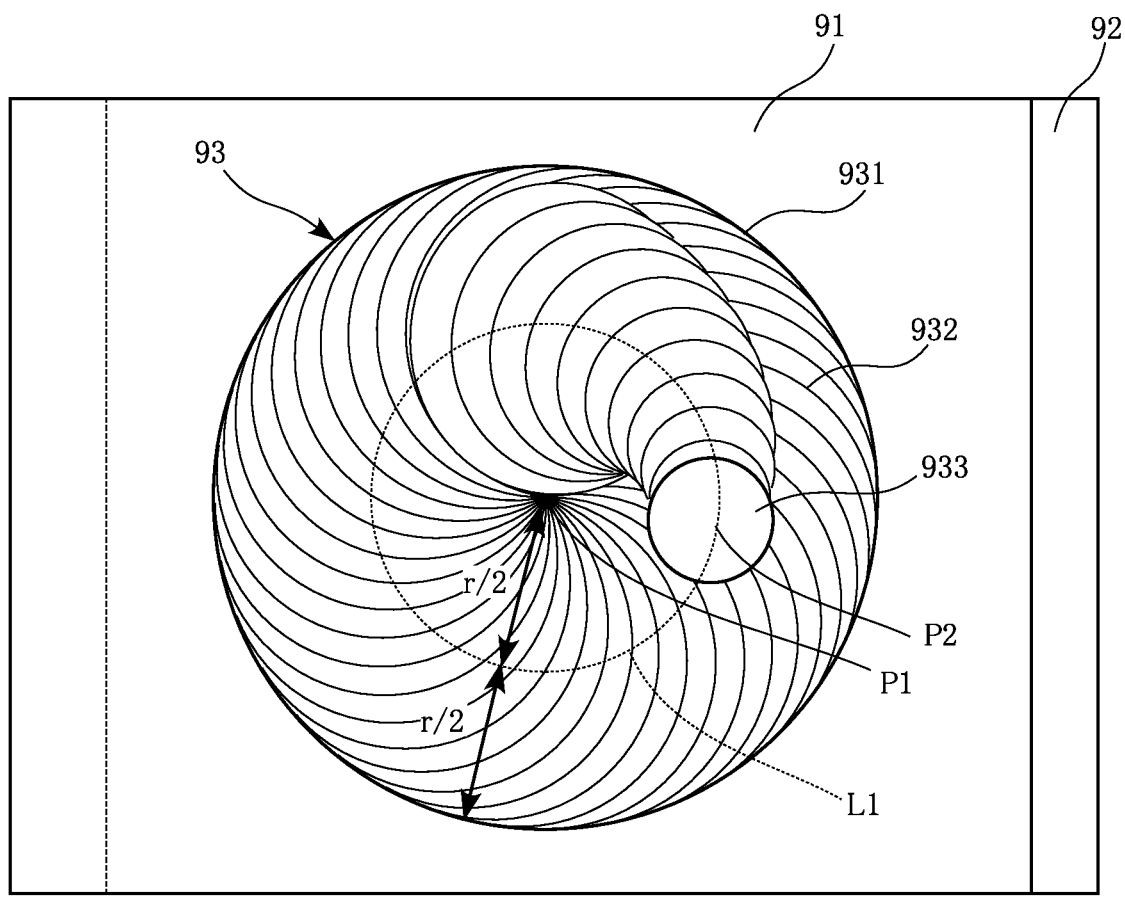
FIG. 18 is a plan view showing a joint structure according to a variation.

In the joint structure A1 according to the first embodiment, the radius of curvature of each linear mark 932 is the same as shown in FIG. 1. The present disclosure, however, is not limited to this, and the radius of curvature of each linear mark 932 may not be the same. FIG. 18 shows an example of such a modification. In the example shown in FIG. 18, the linear marks 932 include a certain number of linear marks that are configured such that the radius of curvature is smaller for a linear mark formed ahead in a predetermined direction or sense (e.g., clockwise in FIG. 18) extending along the outer circumferential edge 931 than for another linear mark formed behind. The smallest radius of curvature of the linear marks 932 is substantially the same as the radius of curvature of the crater portion 933, for example. Note that the predetermined direction or sense described above coincides with the moving direction of the second trajectory T2. Such welding marks as described above can be formed depending on, for example, how easily the first metal member 91 and the second metal member 92 melt, or the degree of diffusion of heat generated by the laser beam.

Figure 19:
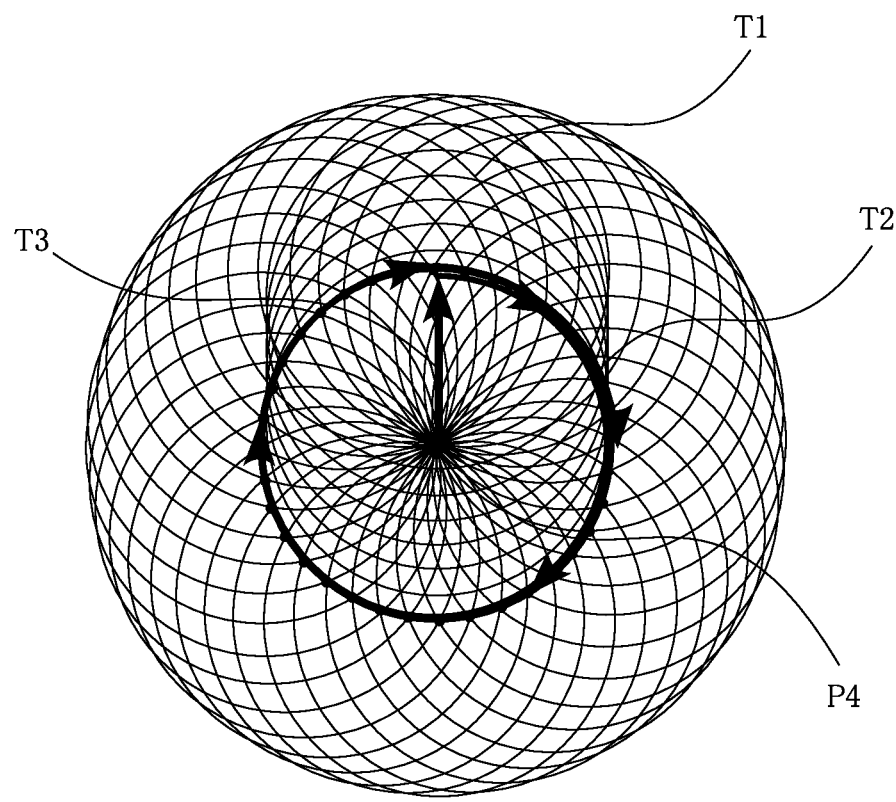
FIG. 19 shows the trajectories (second trajectory and third trajectory) of a second scan in a joining method according to the variation.
Figure 20:
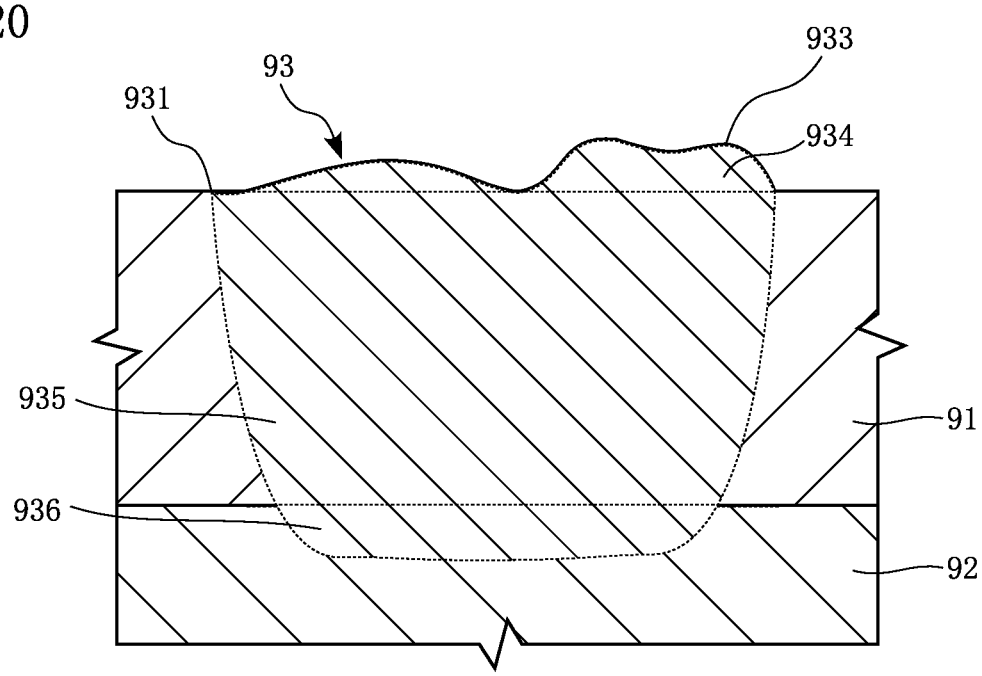
FIG. 20 is a schematic view showing the sectional structure of the joint structure according to the variation.

In the joining method according to the first embodiment, the second trajectory T2 in the second scan is circular in plan view. However, the second trajectory T2 is not limited to this. For example, the reference position P3 may be moved linearly, curvilinearly, elliptically, or polygonally. However, even in such a case, the first scan is performed with an annular movement based on the reference position P3. If the reference position P3 is moved elliptically, the "annular direction" in the present disclosure will be a direction along which an elliptic trajectory is drawn. Furthermore, the second trajectory T2 may not be formed only by moving along a single shape, but also by moving along a plurality of shapes. FIG. 19 shows an example where a linear movement is combined with a circular movement. In the example shown in FIG. 19, the reference position P3 of the first trajectory T1 is moved linearly in the radius direction of the second trajectory T2 (see the third trajectory T3) from the central position (equivalent to the reference position P4) of the second trajectory T2 toward the second trajectory T2. Then, the reference position P3 is moved along the second trajectory T2, as in the example described above. The peak power of the emitted laser beam may be controlled to be the same or different between the period in which the reference position P3 is moved along the third trajectory T3 and the period in which the reference position P3 is moved around once along the second trajectory T2. When the second scan is performed with a combination of multiple trajectories, the welded portion 93 will have a structure as shown in FIG. 20. The welded portion 93 shown in FIG. 20 is different from the welded portion 93 according to the first embodiment in the shape of the bottom portion 936. Specifically, the bottom portion 936 has a circular shape instead of an annular shape in the cross-section along the plane perpendicular to the thickness direction. The welded portion 93 shown in FIG. 20 has an increased joining strength and contributes to lowering resistance by increasing a conductive path.

Next, a semiconductor device according to a second embodiment will be described with reference to FIGS. 21 to 24. In the following descriptions, elements that are the same as or similar to the elements in the first embodiment are provided with the same reference signs, and descriptions thereof are omitted.

Figure 21:
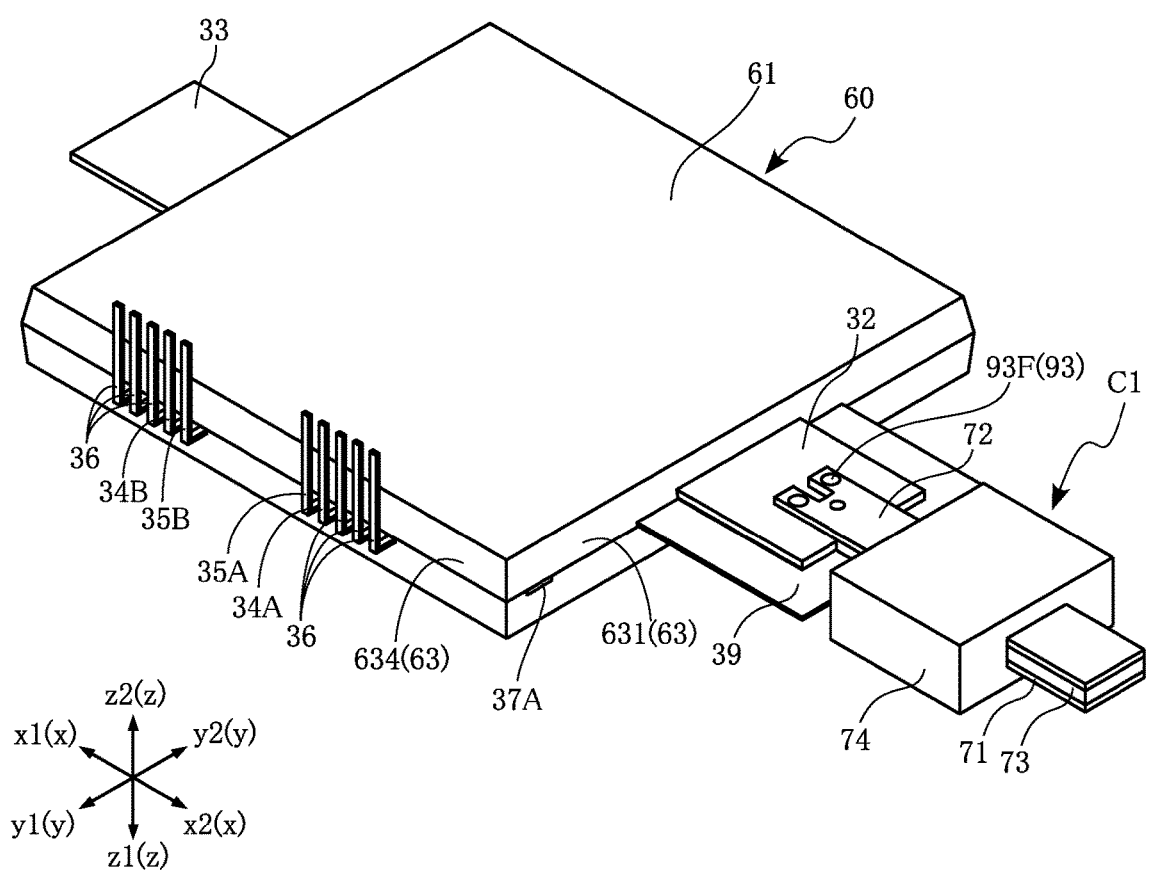
FIG. 21 is a perspective view showing a semiconductor device according to a second embodiment.
Figure 22:
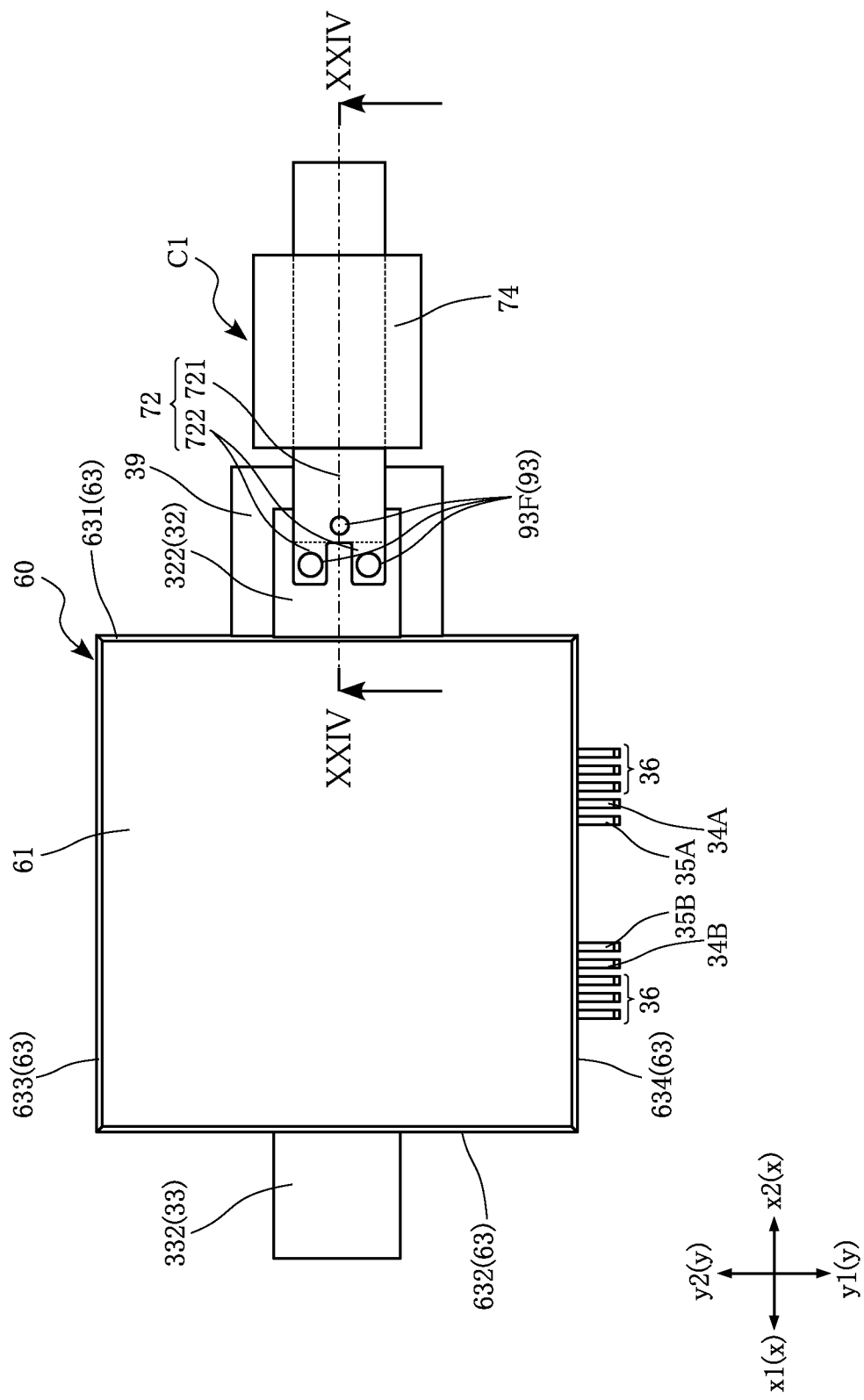
FIG. 22 is a plan view showing the semiconductor device according to the second embodiment.
Figure 23:
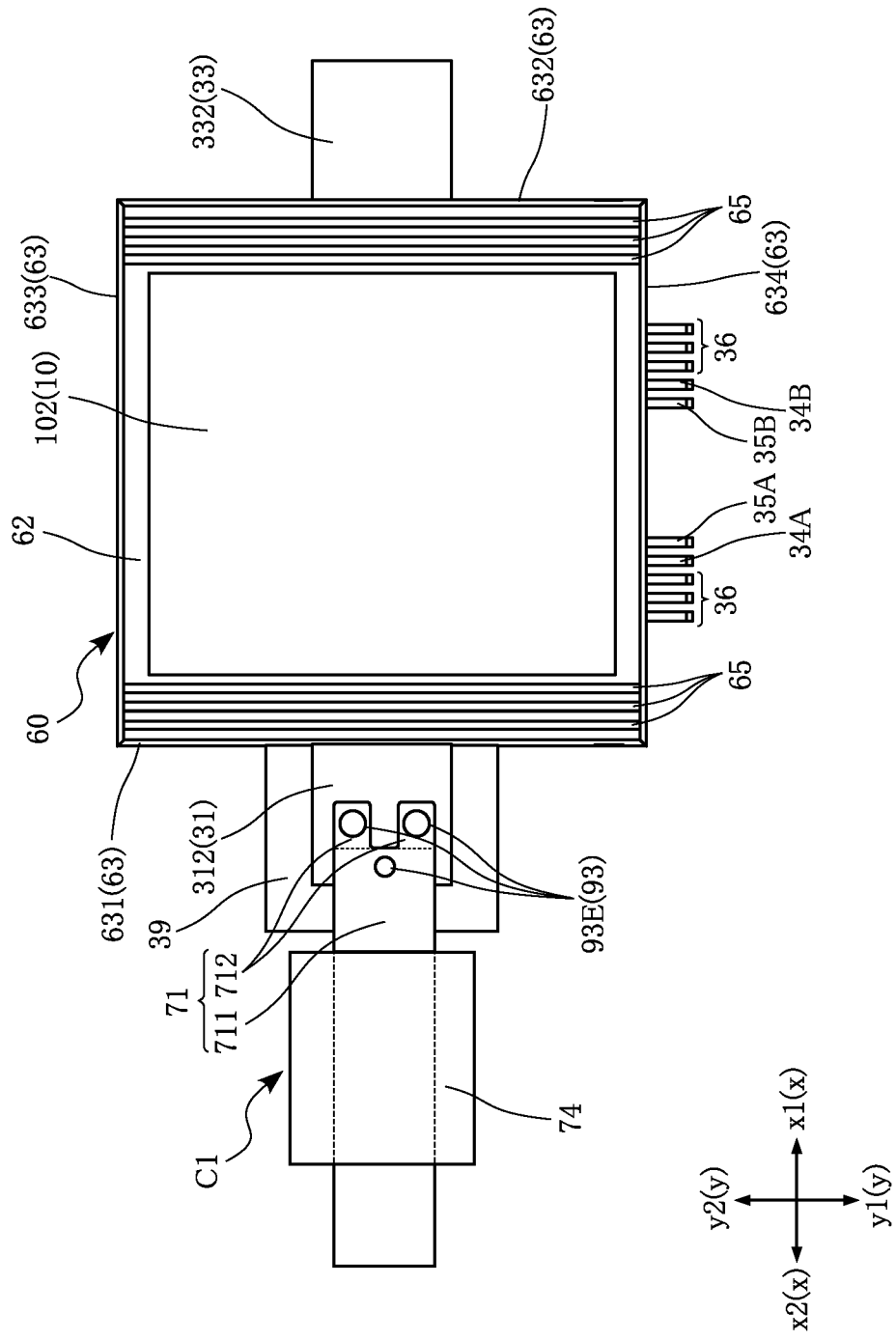
FIG. 23 is a bottom view showing the semiconductor device according to the second embodiment.
Figure 24:
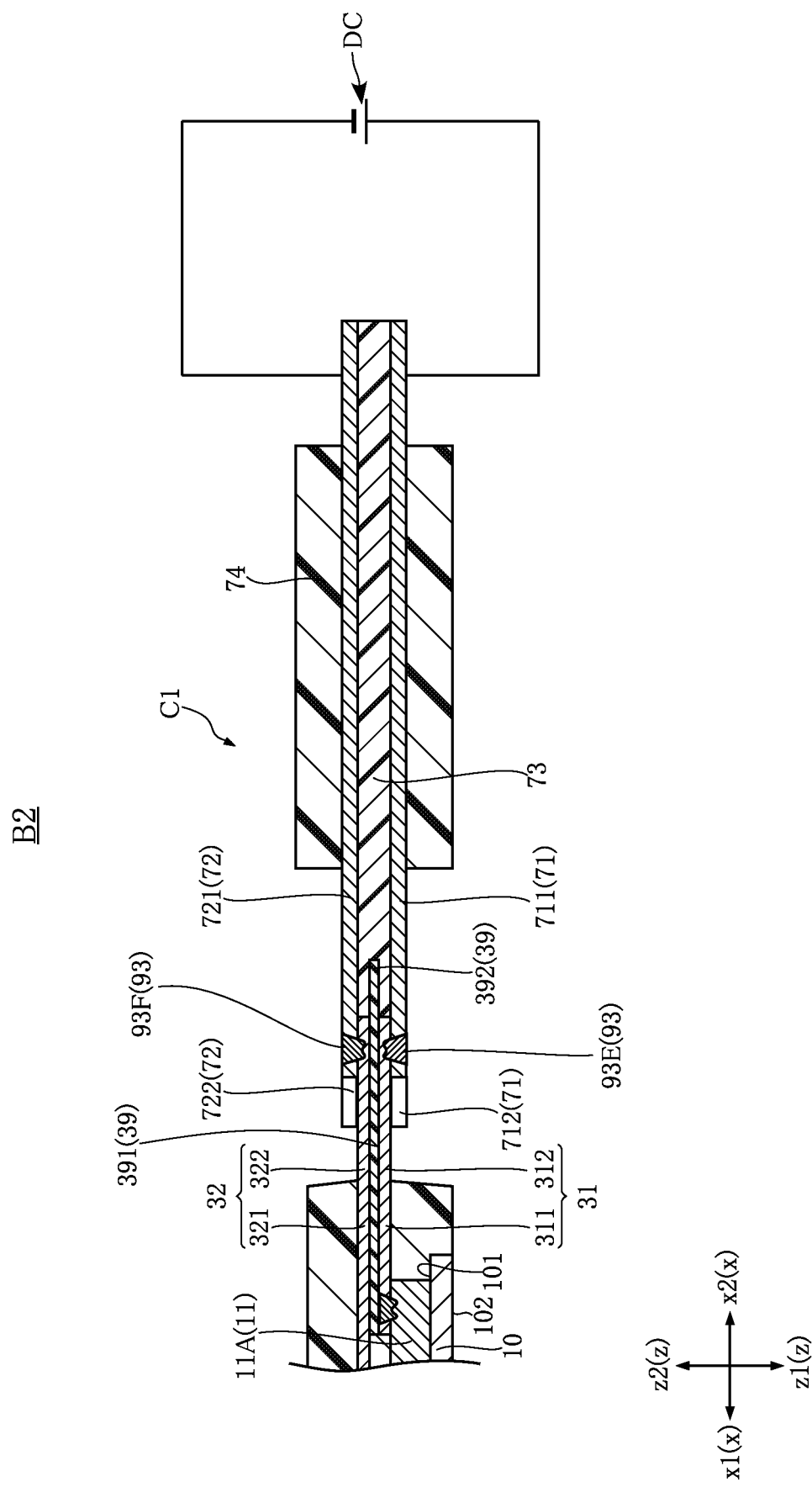
FIG. 24 is a cross-sectional view along line XXIV-XXIV in FIG. 22.

A semiconductor device B2 according to the second embodiment is different from the semiconductor device B1 mainly in the following points. That is, the semiconductor device B2 further includes a bus bar C1, and the plurality of welded portions 93 further include a plurality of supply-terminal joining portions 93E and a plurality of supply-terminal joining portions 93F. The semiconductor device B2 includes the semiconductor device B1, and the bus bar C1 connected to the semiconductor device B1 via the plurality of supply-terminal joining portions 93E and the plurality of supply-terminal joining portions 93F. FIG. 21 is a perspective view showing the semiconductor device B2. FIG. 22 is a plan view showing the semiconductor device B2. FIG. 23 is a bottom view showing the semiconductor device B2. FIG. 24 is a cross-sectional view along line XXIV-XXIV in FIG. 22.

As shown in FIGS. 21 to 24, the bus bar C1 includes two supply terminals 71 and 72, an insulator 73, and a mold resin 74.

Each of the two supply terminals 71 and 72 is a metal plate. The metal plate is made of Cu or a Cu alloy, for example. As shown in FIGS. 21 to 24, each of the supply terminals 71 and 72 has a band shape extending in the x direction. The supply terminal 72 is separated apart from the supply terminal 71 toward the side in which the obverse surface 101 of the insulating substrate 10 in the z direction faces. In plan view, the supply terminal 72 overlaps with the supply terminal 71. In the example shown in FIGS. 22 to 24, the supply terminal 71 has the same shape as the supply terminal 72. The dimension of each of the supply terminals 71 and 72 in the z direction is 0.8 mm, for example, but it is not limited to this.

As shown in FIG. 24, the supply terminal 71 is joined to the input terminal 31 by laser welding and electrically connected to the input terminal 31. The supply terminal 71 has an end portion that is exposed from the mold resin 74 and includes a base portion 711 and a plurality of extended portions 712. The plurality of extended portions 712 extend from the base portion 711 in the x1 direction. Each of the extended portions 712 is rectangular in plan view. In the present embodiment, two extended portions 712 are provided. The two extended portions 712 are spaced apart from each other in the y direction. As a result, the end portion of the supply terminal 71 has a recessed shape. The shape of the supply terminal 71 is not limited to the example above. For example, the portion exposed from the mold resin 74 as a whole may have a rectangular shape in plan view.

As shown in FIG. 24, the supply terminal 72 is joined to the input terminal 32 by laser welding and electrically connected to the input terminal 32. The supply terminal 72 has an end portion that is exposed from the mold resin 74 and includes a base portion 721 and a plurality of extended portions 722. The plurality of extended portions 722 extend from the base portion 721 in the x1 direction. Each of the extended portions 722 is rectangular in plan view. In the present embodiment, two extended portions 722 are provided. The two extended portions 722 are spaced apart from each other in the y direction. As a result, the end portion of the supply terminal 72 has a recessed shape. The shape of the supply terminal 72 is not limited to the example above. For example, the portion exposed from the mold resin 74 as a whole may have a rectangular shape in plan view.

As shown in FIG. 24, the insulator 73 is disposed between the two supply terminals 71 and 72. The insulator 73 is electrically insulative, and is made of a synthetic resin such as a glass epoxy resin, for example. The surface of the supply terminal 71 facing in the z2 direction is in contact with the insulator 73. The surface of the supply terminal 72 facing in the z1 direction is in contact with the insulator 73. The supply terminal 71 and the supply terminal 72 form a laminated wire by overlapping with each other in plan view and being electrically insulated from each other by the insulator 73.

As shown in FIG. 24, the mold resin 74 covers parts of the respective supply terminals 71 and 72, and a part of the insulator 73. The mold resin 74 is made of an electrically insulative synthetic resin, such as an epoxy resin. Parts of the respective supply terminals 71 and 72 and a part of the insulator 73 protrude from both sides of the mold resin 74 in the x direction. Note that the bus bar C1 may not be provided with the mold resin 74.

As shown in FIGS. 23 and 24, each of the plurality of supply-terminal joining portions 93E is a portion where a part of the supply terminal 71 and a part of the input terminal 31 that overlap with each other in plan view are fused to each other by laser welding. The supply-terminal joining portions 93E join the supply terminal 71 as the first metal member 91 and the input terminal 31 as the second metal member 92, thereby forming a joint structure A1. In the example shown in FIG. 23, three supply-terminal joining portions 93E are provided, but the number of supply-terminal joining portions 93E is not particularly limited. In the joint structure A1 including the supply-terminal joining portions 93E, the second metal member 92 is thinner than that in each joint structure A1 according to the first embodiment.

As shown in FIG. 23, each of the supply-terminal joining portions 93E formed in the extended portions 712 of the supply terminal 71 has a larger radius (equivalent to the radius of the outer circumferential edge 931) in plan view than the supply-terminal joining portion 93E formed in the base portion 711 of the supply terminal 71. This is because the width (dimension in y direction) of each extended portion 712 is narrower than the width (dimension in y direction) of the base portion 711. Specifically, since the width of each extended portion 712 is narrower than the width of the base portion 711, heat generated during laser welding is less likely to be dissipated. This creates a large molten bath, resulting in an increase in the diameter of each of the supply-terminal joining portions 93E formed in the extended portions 712. In consideration of such a tendency, the various conditions of laser welding (e.g., the peak power of a laser beam) may be adjusted, so that the radii of the respective supply-terminal joining portions 93E in plan view are substantially the same.

As shown in FIGS. 21, 22, and 24, each of the plurality of supply-terminal joining portions 93F is a portion where a part of the supply terminal 72 and a part of the input terminal 32 that overlap with each other in plan view are fused to each other by laser welding. The supply-terminal joining portions 93F join the supply terminal 72 as the first metal member 91 and the input terminal 32 as the second metal member 92, thereby forming a joint structure A1. In the present embodiment, three supply-terminal joining portions 93F are provided. In the example shown in FIG. 22, the number of supply-terminal joining portions 93F is not particularly limited. In the joint structure A1 including the supply-terminal joining portions 93F, the second metal member 92 is thinner than that in each of the joint structures A1 according to the first embodiment.

As shown in FIG. 22, each of the supply-terminal joining portions 93F formed in the extended portions 722 of the supply terminal 72 has a larger radius (equivalent to the radius of the outer circumferential edge 932) in plan view than the supply-terminal joining portion 93F formed in the base portion 721 of the supply terminal 72. This is because the width (dimension in y direction) of each extended portion 722 is narrower than the width (dimension in y direction) of the base portion 721. Specifically, since the width of each extended portion 722 is narrower than the width of the base portion 721, heat generated during laser welding is less likely to be dissipated. This creates a large molten bath, resulting in an increase in the diameter of each of the supply-terminal joining portions 93F formed in the extended portions 722. In consideration of such a tendency, the various conditions of laser welding (e.g., the peak power of a laser beam) may be adjusted, so that the radii of the respective supply-terminal joining portions 93F in plan view are substantially the same.

In the semiconductor device B2, the supply terminal 71 is a positive electrode, and the supply terminal 72 is a negative electrode. For example, as shown in FIG. 24, the two supply terminals 71 and 72 are connected to a direct-current power supply DC in the x2 direction. In this way, the power supply voltage of the direct-current power supply DC is applied between the two input terminals 31 and 32 via the bus bar C1.

Next, advantages of the semiconductor device B2 according to the second embodiment will be described.

The semiconductor device B2 includes the plurality of welded portions 93. In other words, similarly to the first embodiment, the metal members are joined by the welded portions 93 formed by laser welding. As such, the two metal members do not rub against each other, thus preventing the generation of dust. This makes it possible to suppress malfunctions of the semiconductor device B2. Furthermore, since the welded portions 93 are formed by the joining method described above, the generation of spatters can be suppressed. This also makes it possible to suppress malfunctions of the semiconductor device B2.

The semiconductor device B2 includes the input terminals 31 and 32. The input terminal 31 has the terminal portion 312. The input terminal 32 has the terminal portion 322. The semiconductor device B2 further includes the bus bar C1. The bus bar C1 includes the two supply terminals 71 and 72. The terminal portion 322 of the input terminal 32 is separated apart from the terminal portion 312 of the input terminal 31 in the z direction, and overlaps with the terminal portion 312 of the input terminal 31 in plan view. The supply terminal 72 is separated apart from the supply terminal 71 in the z direction, and overlaps with the supply terminal 71 in plan view. The supply terminal 71 and the terminal portion 312 of the input terminal 31 are joined by the plurality of supply-terminal joining portions 93E, and the supply terminal 72 and the terminal portion 322 of the input terminal 32 are joined by the plurality of supply-terminal joining portions 93F. As a result, the terminal portion 312 and the supply terminal 71, together with the terminal portion 322 and the supply terminal 72, form a continuous laminated wire. Accordingly, the power supplied from the direct-current power supply DC to the semiconductor device B2 passes through the laminated wire. As such, the inductance generated within the semiconductor device B2 can be reduced more stably by the laminated wire. Thus, according to the semiconductor device B2, the internal inductance can be reduced more stably.

In the semiconductor device B2, the bus bar C1 includes the insulator 73 disposed between the two supply terminals 71 and 72 in the z direction. This makes it possible to easily form a laminated wire with the supply terminals 71 and 72.

In the semiconductor device B2, the supply terminal 71 and the input terminal 31 are joined by three supply-terminal joining portions 93E. The three supply-terminal joining portions 93E are formed by laser welding in the joining method described above. It is possible to further increase the joining strength between the supply terminal 71 and the input terminal 31 by increasing the number of supply-terminal joining portions 93E. However, this increases the number of times laser welding is performed, and as a result, the manufacturing process becomes more laborious and the heat generated by laser welding may cause a thermal strain in the supply terminal 71. For this reason, in order to reduce the labor of the manufacturing process and reduce the effect of a thermal strain, it is preferable that the supply terminal 71 and the input terminal 31 be joined by three supply-terminal joining portions 93E. It is also for this reason that the supply terminal 72 and the input terminal 32 are joined by three supply-terminal joining portions 93F.

In the semiconductor device B2, the bus bar C1 includes the supply terminal 71. The supply terminal 71 includes the base portion 711, and the plurality of extended portions 712 extending out of the base portion 711. As shown in FIG. 23, a part of the supply terminal 71 that is joined to the input terminal 31 is divided into two. In this way, when the joining is performed with the three supply-terminal joining portions 93E as described above, the effect of a thermal strain can be further reduced. For this reason, as shown in FIG. 22, a part of the supply terminal 72 that is joined to the input terminal 32 is also divided into two.

Figure 25:
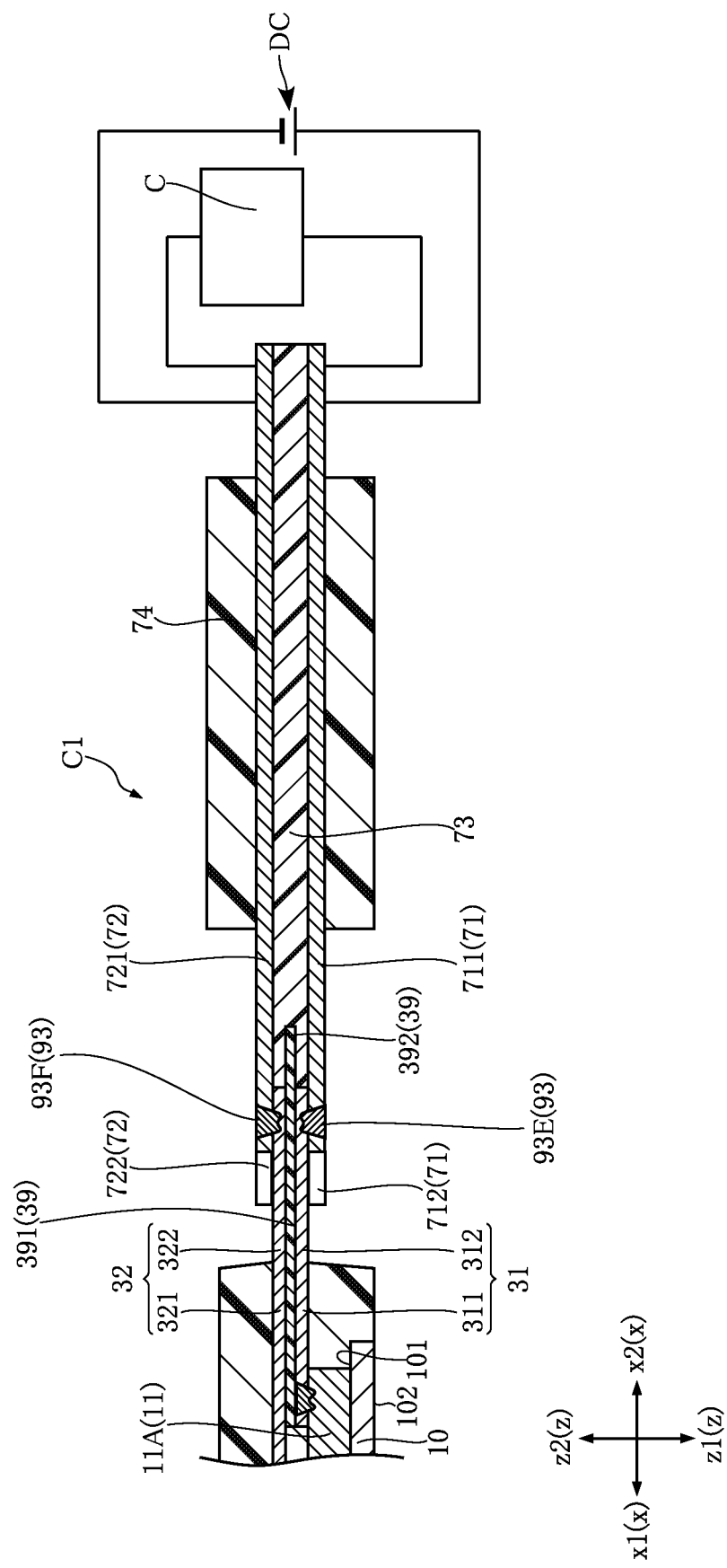
FIG. 25 is a cross-sectional view showing a semiconductor device according to a variation of the second embodiment.

In the second embodiment, the direct-current power supply DC is connected to the two supply terminals 71 and 72, as shown in FIG. 24. However, the present disclosure is not limited to this. As shown in FIG. 25, a capacitor C may be further connected. The capacitor C is connected in parallel to the direct-current power supply DC. The capacitor C is a ceramic capacitor or a film capacitor, for example. The capacitance of the capacitor C is set according to the frequency characteristics of the semiconductor device B2. When the plurality of switching elements of the semiconductor device B2 are driven, a counter-electromotive force, which causes inductance, is generated in the two input terminals 31 and 32. The capacitor C functions to store the counter-electromotive force as an electric charge.

Figure 26:
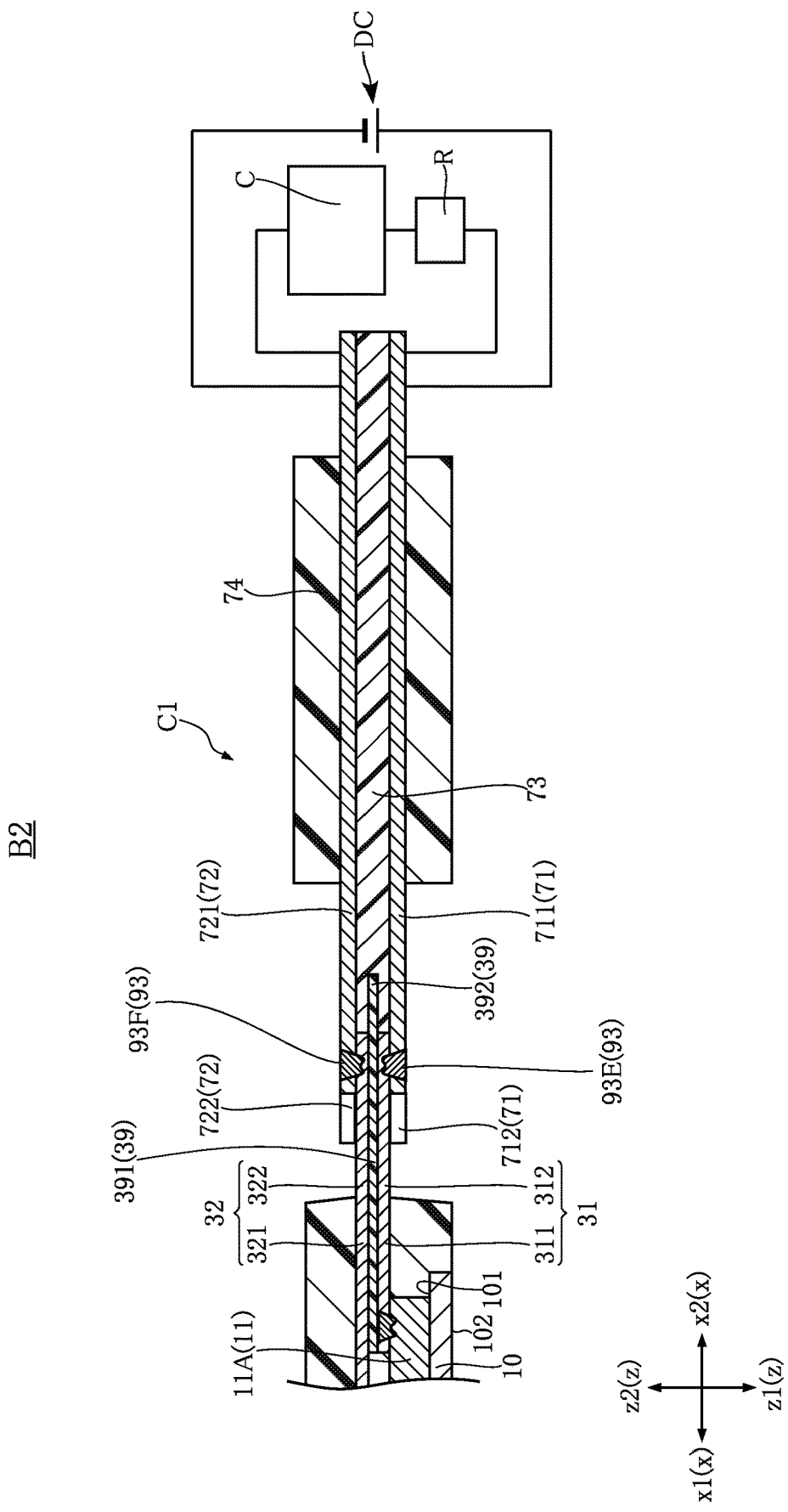
FIG. 26 is a cross-sectional view showing the semiconductor device according to the variation of the second embodiment.

Accordingly, in the example shown in FIG. 25, the inductance of the semiconductor device B2 can be reduced more effectively. Note that the charge stored in the capacitor C is utilized as a part of the DC power supplied to the semiconductor device B1. Alternatively, as shown in FIG. 26, a series circuit consisting of the capacitor C and a resistor R may be connected. The series circuit is a so-called RC snubber circuit, and is connected in parallel to the direct-current power supply DC. The resistor R can reduce the voltage of the counter-electromotive force generated in the two input terminals 31 and 32. Accordingly, in the example shown in FIG. 26, it is possible to reduce the inductance of the semiconductor device B2 as in the example described above, and to prevent overcharging of the capacitor C.

Figure 27:
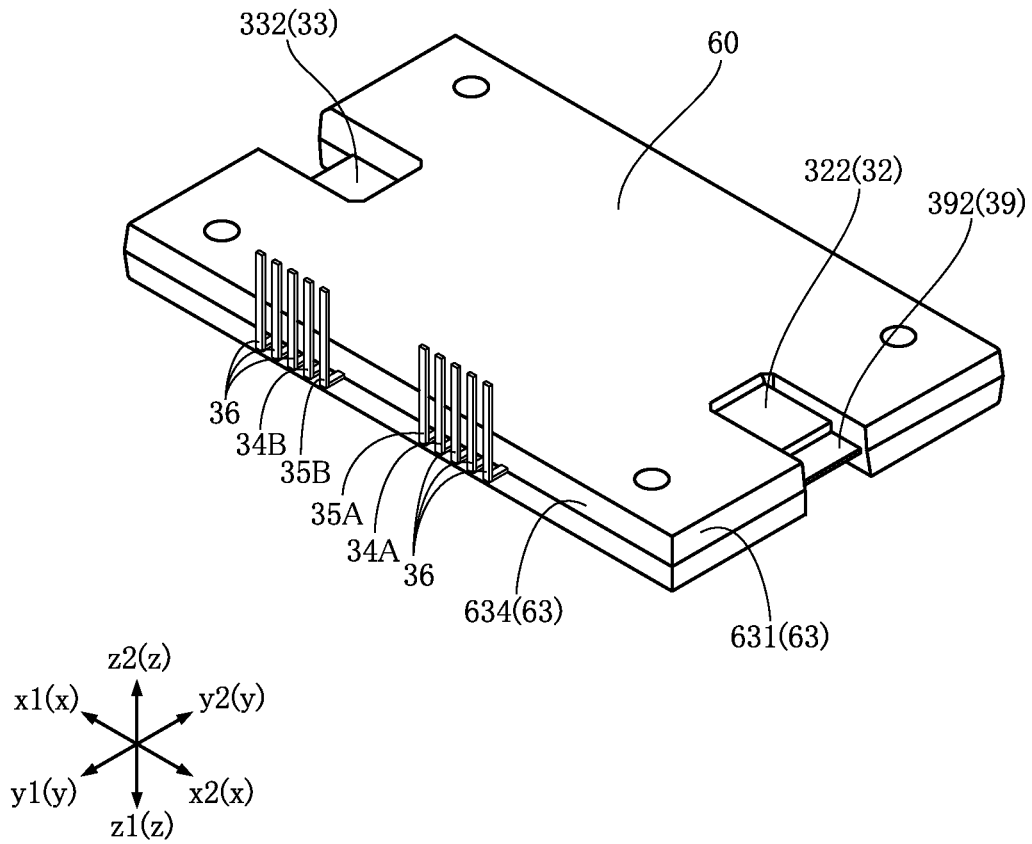
FIG. 27 is a perspective view showing a semiconductor device according to a third embodiment.

FIG. 27 shows a semiconductor device according to a third embodiment. The semiconductor device B3 according to the third embodiment is different from the semiconductor device B1 in the shape of the sealing resin 60. Other than that, the semiconductor device B3 is the same as the semiconductor device B1. FIG. 27 is a perspective view showing the semiconductor device B3.

In the sealing resin 60 of the present embodiment, each of the edge portions in the y direction extends out in the x direction in plan view. A part of the sealing resin 60 extending in the x2 direction covers parts of the two input terminals 31, 32 and the insulating member 39. Furthermore, a part of the sealing resin 60 extending in the x1 direction covers a part of the output terminal 33.

The sealing resin 60 of the semiconductor device B3 is larger than that of the semiconductor device B1, and covers parts of the input terminals 31, 32, the output terminal 33, and the insulating member 39 more extensively. In this way, the semiconductor device B3 can protect the two input terminals 31 and 32, the output terminal 33, and the insulating member 39 against deterioration and bends more effectively than the semiconductor device B1.

The semiconductor device B3 may also be connected to the bus bar C1 described in the second embodiment.

In the joint structure A1 described above, the surfaces of the first metal member 91 and the second metal member 92 are Cu surfaces, but the present disclosure is not limited to this. For example, either or both of the surfaces of the first metal member 91 and the second metal member 92 may be covered with metal plating. For example, Sn or nickel (Ni) may be used for the metal plating. The following describes the case where either the first metal member 91 or the second metal member 92 is covered with metal plating. The melting point of Cu is 1085° C., the melting point of Sn is 232° C., and the melting point of Ni is 1453° C.

FIGS. 28 to 32 are provided to explain joint structures (welded portions 93) in modifications. Each of the welded portions 93 shown in these figures is formed by performing only the first scan (and not the second scan). FIGS. 28 to 32 are schematic cross-sectional views showing the respective joint structures.

Figure 28:
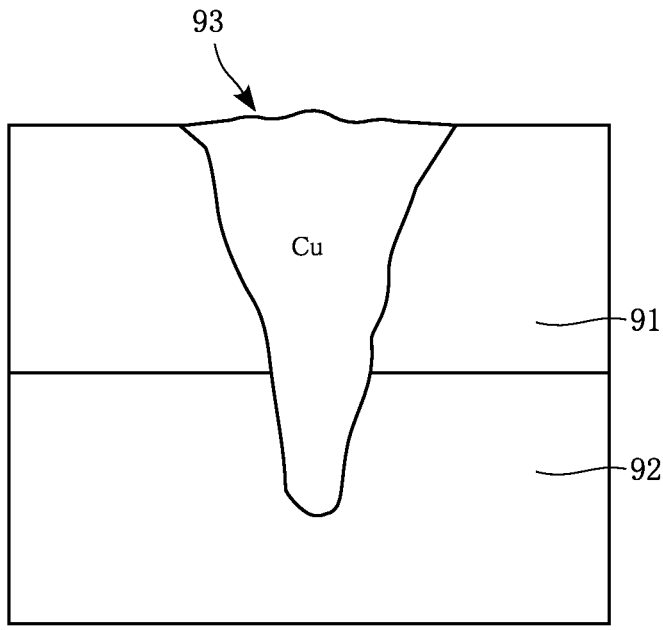
FIG. 28 is a schematic cross-sectional view for explaining a welded portion according to a variation.
Figure 29:
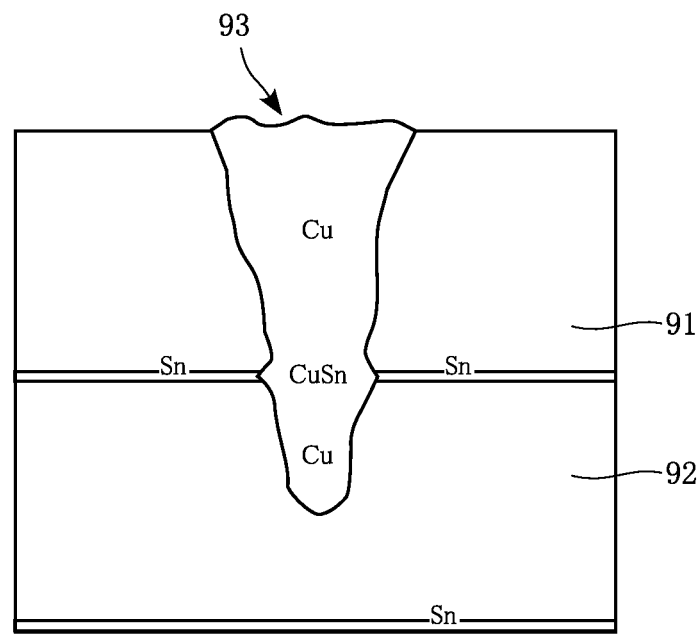
FIG. 29 is a schematic cross-sectional view for explaining a welded portion according to a variation.
Figure 30:
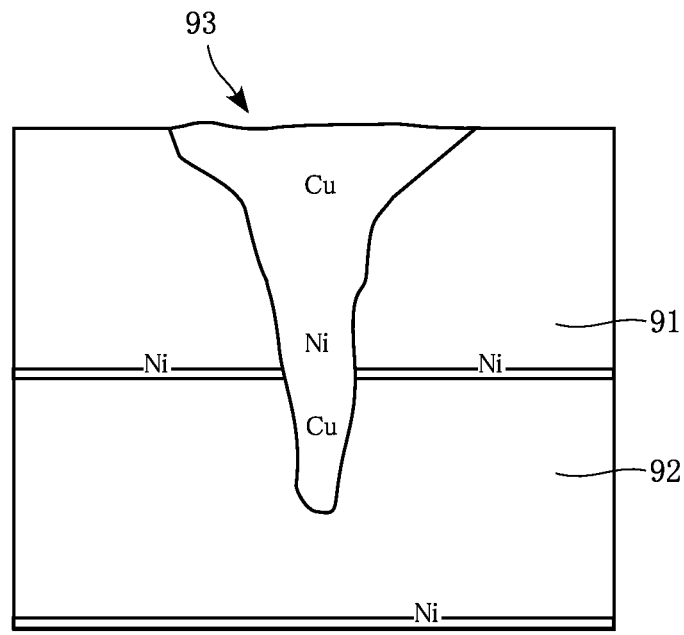
FIG. 30 is a schematic cross-sectional view for explaining a welded portion according to a variation.
Figure 31:
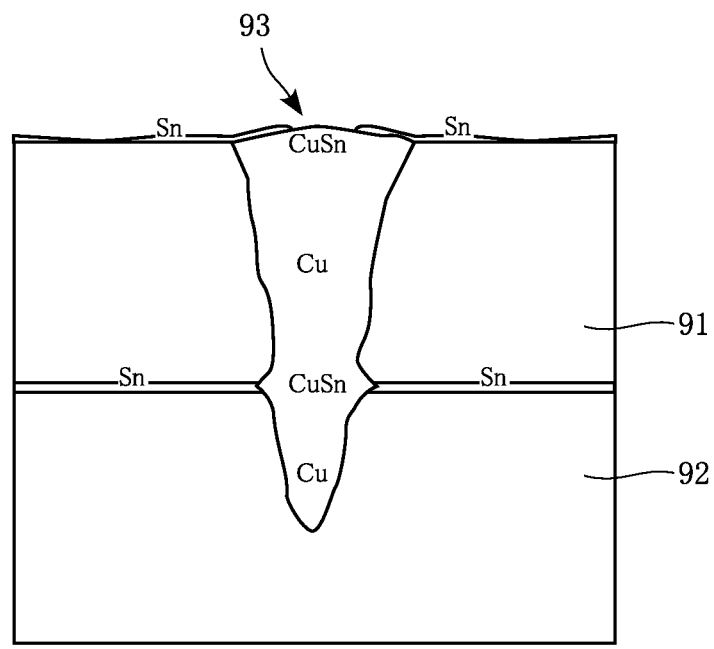
FIG. 31 is a schematic cross-sectional view for explaining a welded portion according to a variation.
Figure 32:
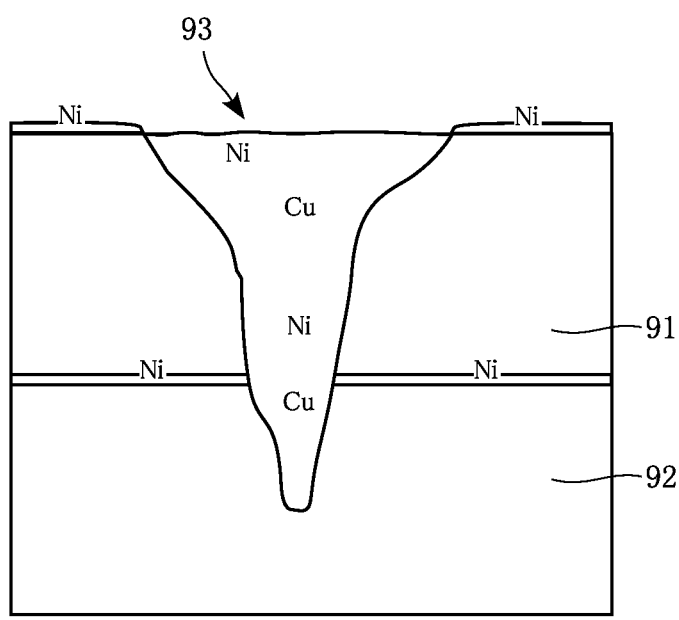
FIG. 32 is a schematic cross-sectional view for explaining a welded portion according to a variation.

FIG. 28 shows an example where neither the surface of the first metal member 91 nor the surface of the second metal member 92 is plated. FIG. 28 corresponds to the joint structure A1, and is provided for comparison with the examples (FIGS. 29 to 32) according to modifications. FIG. 29 shows an example in which the first metal member 91 is not covered with metal plating whereas the second metal member 92 is covered with Sn plating. FIG. 30 shows an example in which the first metal member 91 is not covered with metal plating whereas the second metal member 92 is covered with Ni plating. FIG. 31 shows an example in which the first metal member 91 is covered with Sn plating whereas the second metal member 92 is not covered with metal plating. FIG. 32 shows an example in which the first metal member 91 is covered with Ni plating whereas the second metal member 92 is not covered with metal plating.

As shown in FIGS. 29 and 31, when the first metal member 91 or the second metal member 92 is covered with Sn plating, the welded portion 93 bulges to the sides near the interface between the first metal member 91 and the second metal member 92. This is because Sn has a lower melting point than Cu, resulting in Sn melting before Cu due to the heat generated by the laser beam. The composition of the welded portion 93 partly contains a CuSn alloy.

On the other hand, as shown in FIGS. 30 and 32, when the first metal member 91 or the second metal member 92 is covered with Ni plating, bulging of the welded portion 93 near the interface between the first metal member 91 and the second metal member 92 as shown in FIGS. 29 and 31 does not occur. Furthermore, the composition of the welded portion 93 does not contain any CuNi alloys, and Cu and Ni coexist.

As described above, even when either or both of the first metal member 91 and the second metal member 92 are covered with metal plating (see FIGS. 29 to 32), the joining strength between the first metal member 91 and the second metal member 92 is substantially the same as when they are not covered with metal plating (see FIG. 28). Furthermore, the conductivity of each of the welded portions 93 is substantially the same as well. In other words, in the joint structure of the present disclosure, the first metal member 91 and the second metal member 92 may be provided with metal plating as appropriate.

The joint structure, the semiconductor device, and the joining method according to the present disclosure are not limited to those in the above embodiments. Various design changes can be made to the specific configurations of the elements of the joint structure and the semiconductive device of the present disclosure, and to the specific processes in the operations in the joining method according to the present disclosure.

The invention claimed is:

1. A joint structure comprising a first metal member and a second metal member that overlap with each other as viewed in a first direction and that are joined to each other, the joint structure further comprising:
    a welded portion in which a part of the first metal member and a part of the second metal member are fused to each other in an area where the first metal member and the second metal member overlap with each other,
    wherein the welded portion includes:
    an outer circumferential edge that is annular as viewed in the first direction; and
    a plurality of marks each extending from an inside of the welded portion toward the outer circumferential edge as viewed in the first direction, and
    wherein each of the plurality of linear marks is curved to bulge to one side in an annular direction along the outer circumferential edge,
    the outer circumferential edge has an annular shape centered at a first reference point, and
    each of the plurality of marks extends from the first reference point toward the outer circumferential edge, and bulges in a first sense of a circumferential direction of the outer circumferential edge.

2. The joint structure according to claim 1, wherein the welded portion further comprises a crater portion that is circular as viewed in the first direction, and
    the crater portion has a diameter smaller than a radius of the outer circumferential edge.

3. The joint structure according to claim 2, wherein a center of the crater portion as viewed in the first direction is located at a midpoint of a line segment connecting the first reference point and the outer circumferential edge.

4. The joint structure according to claim 2, wherein each of the plurality of marks has an arc shape as viewed in the first direction, and
    the plurality of marks include a number of marks configured such that radiuses of curvature thereof are smaller as disposed ahead in a second sense of the circumferential direction.

5. The joint structure according to claim 1, wherein the welded portion comprises a bottom portion overlapping with the second metal member as viewed in a second direction perpendicular to the first direction.

6. The joint structure according to claim 5, wherein the bottom portion is annular in a cross-section perpendicular to the first direction.

7. A semiconductor device comprising:
    a first conductive member including an obverse surface and a reverse surface that are spaced apart from each other in a first direction;
    a first switching element conductively bonded to the obverse surface of the first conductive member;
    a sealing resin covering the first conductive member and the first switching element;
    a first terminal including a first terminal portion exposed from the sealing resin, the first terminal being electrically connected to the first conductive member; and
    a second terminal including a second terminal portion exposed from the sealing resin, the second terminal being electrically connected to the first switching element,
    wherein the first terminal and the first conductive member overlap with each other as viewed in the first direction and include respective parts that are fused to each other, thereby forming a welded portion, and
    the welded portion comprises a first joining portion extending from the first terminal into the first conducive member.

8. The semiconductor device according to claim 7, wherein the first terminal is thinner than the first conductive member.

9. The semiconductor device according to claim 7, comprising:
    a second conductive member disposed on the obverse surface and separated apart from the first conductive member;
    a second switching element conductively bonded to the second conductive member; and
    a third terminal including a third terminal portion and electrically connected to the second conductive member,
    wherein the first conductive member is electrically connected to the second switching element.

10. The semiconductor device according to claim 9, wherein the welded portion comprises a second joining portion extending from the third terminal as the first metal member into the second conductive member as the second metal member.

11. The semiconductor device according to claim 9, wherein the third terminal is thinner than the second conductive member.

12. The semiconductor device according to claim 9, further comprising an insulating member disposed between the second terminal portion and the third terminal portion in the first direction,
    wherein a part of the insulating member overlaps with the second terminal portion and the third terminal portion as viewed in the first direction.

13. The semiconductor device acording to claim 12, further comprising a bus bar that includes a first supply terminal, a second supply terminal, and an insulator,
    wherein the second supply terminal is separated apart from the first supply terminal in the first direction, and at least partially overlaps with the first supply terminal as viewed in the first direction,
    the insulator is disposed between the first supply terminal and the second supply terminal in the first direction, and the first supply terminal is conductively bonded to the second terminal portion, and the second supply terminal is conductively bonded to the third terminal.

14. The semiconductor device according to claim 13, further comprising a capacitor connected in parallel to the first supply terminal and the second supply terminal.

15. The semiconductor device according to claim 13, wherein the welded portion comprises a third joining portion extending from the first supply terminal as the first metal member into the second terminal portion as the second metal member.

16. The semiconductor device according to claim 15, wherein the first supply terminal includes an end portion that is recessed in an area overlapping with the second terminal portion as viewed in the first direction.

17. The semiconductor device according to claim 16, wherein the end portion includes a base portion, and two extended portions extending from the base portion, and
the third joining portion is provided for the two extended portions and the base portion.

\* \* \* \* \*